(12) United States Patent
Kim et al.

(10) Patent No.: US 11,988,495 B2
(45) Date of Patent: May 21, 2024

(54) THROUGH-FOCUS IMAGE-BASED METROLOGY DEVICE, OPERATION METHOD THEREOF, AND COMPUTING DEVICE FOR EXECUTING THE OPERATION

(71) Applicant: SAMSUNG ELECTRONICS CO., LTD., Suwon-si (KR)

(72) Inventors: Kwangsoo Kim, Osan-si (KR); Sungyoon Ryu, Seoul (KR); Daejun Park, Hwaseong-si (KR); Seong Yun, Suwon-si (KR); Seungryeol Oh, Daejeon (KR); Sujin Lee, Gwangmyeong-si (KR); Jaeyong Lee, Suwon-si (KR); Minho Rim, Hwaseong-si (KR); Chungsam Jun, Suwon-si (KR); Myungjun Lee, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 438 days.

(21) Appl. No.: 17/156,049

(22) Filed: Jan. 22, 2021

(65) Prior Publication Data

US 2021/0396510 A1 Dec. 23, 2021

(30) Foreign Application Priority Data

Jun. 18, 2020 (KR) ........................ 10-2020-0074100

(51) Int. Cl.
*G01B 11/02* (2006.01)
*G01N 21/88* (2006.01)
*G03F 7/00* (2006.01)

(52) U.S. Cl.
CPC ......... *G01B 11/02* (2013.01); *G01N 21/8806* (2013.01); *G01N 21/8851* (2013.01);
(Continued)

(58) Field of Classification Search
CPC ..... G01B 11/02; G01B 11/022; G01B 11/024; G01B 11/026; G01B 11/028; G01B 11/03;
(Continued)

(56) References Cited

U.S. PATENT DOCUMENTS 7,619,753 B2 * 11/2009 Liu .................... G01B 9/04
356/625
8,912,495 B2 12/2014 Lange
(Continued)

FOREIGN PATENT DOCUMENTS

JP 3388285 B2 * 3/2003
JP 4756785 B2 * 8/2011
(Continued)

OTHER PUBLICATIONS

Attota, Ravikiran et al., "TSOM method for semiconductor metrology," 2011, Proc. SPIE 7971, Metrology, Inspection, and Process Control for Microlithography XXV, 79710T, pp. 79710T-1 to 79710T-15. (Year: 2011).*
(Continued)

*Primary Examiner* — Gordon J Stock, Jr.
(74) *Attorney, Agent, or Firm* — Sughrue Mion, PLLC

(57) ABSTRACT

Provided is a through-focus image-based metrology device including an optical device, and a computing device configured to acquire at least one through-focus image of a target from the optical device, generate an intensity profile based on the acquired at least one through-focus image, and perform metrology on the target based on the generated intensity profile, wherein the optical device includes a stage on which the target is disposed, the stage being configured to move by one step in at least one direction based on control of the computing device, and to acquire the at least one through-focus image, an image sensor disposed on the stage,
(Continued)

an objective lens disposed between the image sensor and the stage, the objective lens being configured to transmit reflected light from the target, and a light source configured to emit illumination light to the target through the objective lens.

16 Claims, 20 Drawing Sheets

(52) U.S. Cl.
CPC ........ *G03F 7/70625* (2013.01); *G03F 7/7065* (2013.01); *G01B 2210/56* (2013.01); *G01N 2021/8887* (2013.01)

(58) Field of Classification Search
CPC . G01B 11/06; G01B 11/0608; G01B 11/0616; G01B 11/0683; G01B 11/08; G01B 11/14; G01B 11/16; G01B 11/22; G01B 11/24; G01B 11/26; G01B 11/27; G01B 11/272; G01B 11/30; G01B 11/303; G01B 11/306; G01B 2210/56; G01Q 60/24; G03F 7/70616; G03F 7/70625; G03F 7/70633; G03F 7/70641; G03F 7/7065; G03F 7/70666; G03F 7/70675; G03F 7/70683; G01N 21/8806; G01N 21/8851; G01N 2021/8835; G01N 2021/8887
See application file for complete search history.

(56) References Cited

U.S. PATENT DOCUMENTS

| | | | |
|---|---|---|---|
| 9,400,254 B2* | 7/2016 | Shcherbakov | ......... G01B 11/02 |
| 9,816,939 B2 | 11/2017 | Duffy et al. | |
| 9,995,648 B2* | 6/2018 | Shchekin | ........... G01N 21/9501 |
| 10,101,675 B2 | 10/2018 | Polo et al. | |
| 10,127,652 B2 | 11/2018 | Gao et al. | |
| 10,249,544 B2 | 4/2019 | Ryu et al. | |
| 10,267,748 B2 | 4/2019 | Plihal et al. | |
| 10,504,006 B2 | 12/2019 | Bhaviripudi et al. | |
| 11,314,173 B2* | 4/2022 | Levinski | .................. G02B 7/38 |
| 2013/0107030 A1* | 5/2013 | Koptyaev | ............ G02B 21/365 |
| | | | 977/881 |
| 2016/0290796 A1* | 10/2016 | Levy | .................... G03F 7/70525 |
| 2017/0003230 A1 | 1/2017 | Park et al. | |
| 2017/0301079 A1* | 10/2017 | Cho | .................... G02B 21/0052 |
| 2018/0100814 A1* | 4/2018 | Zhang | ........................ G03F 1/84 |
| 2019/0355601 A1* | 11/2019 | Danen | ................ G02B 27/0012 |
| 2022/0171297 A1* | 6/2022 | Feler | ..................... G06T 7/0006 |
| 2022/0172347 A1* | 6/2022 | Tukker | ................. G02B 5/3083 |
| 2022/0309645 A1* | 9/2022 | Tenner | ............... G01N 21/8851 |

FOREIGN PATENT DOCUMENTS

| | | |
|---|---|---|
| KR | 101652356 B1 * | 8/2016 |
| KR | 101826127 B1 * | 2/2018 |
| KR | 101863752 B1 * | 6/2018 |
| WO | 2019/046141 A1 | 3/2019 |

OTHER PUBLICATIONS

Lee, Jun Ho et al., "Through-focus scanning optical microscopy (TSOM) with adaptive optics," 2018, Proc. SPIE 10585, Metrology, Inspection, and Process Control for Microlithography XXXII, 10850C, pp. 105850C-1 to 105850C-10. (Year: 2018).*

Purandare, Sanyogita et al., "Optical inspection of nanoscale structures using a novel machine learning based synthetic image generation algorithm," 2019, Optics Express, vol. 27, No. 13, pp. 17743-17762. (Year: 2019).*

Qu, Yufu et al., "Machine-learning modules for analyzing TSOM images of nanostructures," 2019, Optics Express, vol. 27, No. 23, pp. 33978-33998. (Year: 2019).*

* cited by examiner

THROUGH-FOCUS IMAGE-BASED METROLOGY DEVICE, OPERATION METHOD THEREOF, AND COMPUTING DEVICE FOR EXECUTING THE OPERATION

CROSS-REFERENCE TO RELATED APPLICATION

This application claims priority to Korean Patent Application No. 10-2020-0074100 filed on Jun. 18, 2020 in the Korean Intellectual Property Office, the disclosure of which is incorporated by reference herein in its entirety.

BACKGROUND

Example embodiments of the present disclosure relate to a through-focus image-based metrology device, an operation method thereof, and a computing device for executing the operation.

In general, scattered interference information on a focal position of a three-dimensional fine pattern may be acquired using through-focus scanning optical microscopy (TSOM). This technique may collect two-dimensional images in different focal positions for an object using an optical microscope to create a three-dimensional image data space for the object. Two-dimensional images having an in-focus image and an out-of-focus image include a through-focus image.

SUMMARY

One or more example embodiments provide a through-focus image-based metrology device configured to quantify a non-repetitive pattern, an operation method thereof, and a computing device for executing the operation.

One or more example embodiments also provide a through-focus image-based metrology device configured to quantify in a non-destructive manner, an operation method thereof, and a computing device for executing the operation.

According to an aspect of an example embodiment, there is provided a through-focus image-based metrology device including an optical device, and a computing device configured to acquire at least one through-focus image of a target from the optical device, generate an intensity profile based on the acquired at least one through-focus image, and perform metrology on the target based on the generated intensity profile, wherein the optical device includes a stage on which the target is disposed, the stage being configured to move by one step in at least one direction based on control of the computing device, and to acquire the at least one through-focus image, an image sensor disposed on the stage, an objective lens disposed between the image sensor and the stage, the objective lens being configured to transmit reflected light from the target, and a light source configured to emit illumination light to the target through the objective lens.

According to another aspect of an example embodiment, there is provided a method of operating a through-focus image-based metrology device including an optical device and a computing device controlling the optical device, the method including controlling the optical device by the computing device to acquire a plurality of through-focus images of a target, generating an intensity profile, corresponding to the target, based on the plurality of through-focus images by the computing device, and generating metrology data for target based on the generated intensity profile and a learning model by the computing device.

According to yet another aspect of an example embodiment, there is provided a computing device including a memory configured to store at least one instruction, and at least one processor configured to execute the at least one instruction to control an optical device to acquire a plurality of through-focus images for a target, generate an intensity profile, corresponding to the target, based on the plurality of through-focus images, and generate metrology data for the target based on the generated intensity profile and a learning model.

BRIEF DESCRIPTION OF DRAWINGS

The above and/or other aspects, features, and advantages of example embodiments will be more clearly understood from the following detailed description, taken in conjunction with the accompanying drawings, in which.

DETAILED DESCRIPTION

In the following, the contents of the example embodiments will be described clearly and in detail to the extent that those of ordinary skill in the technical field may easily implement it using the drawings.

Figure 1:
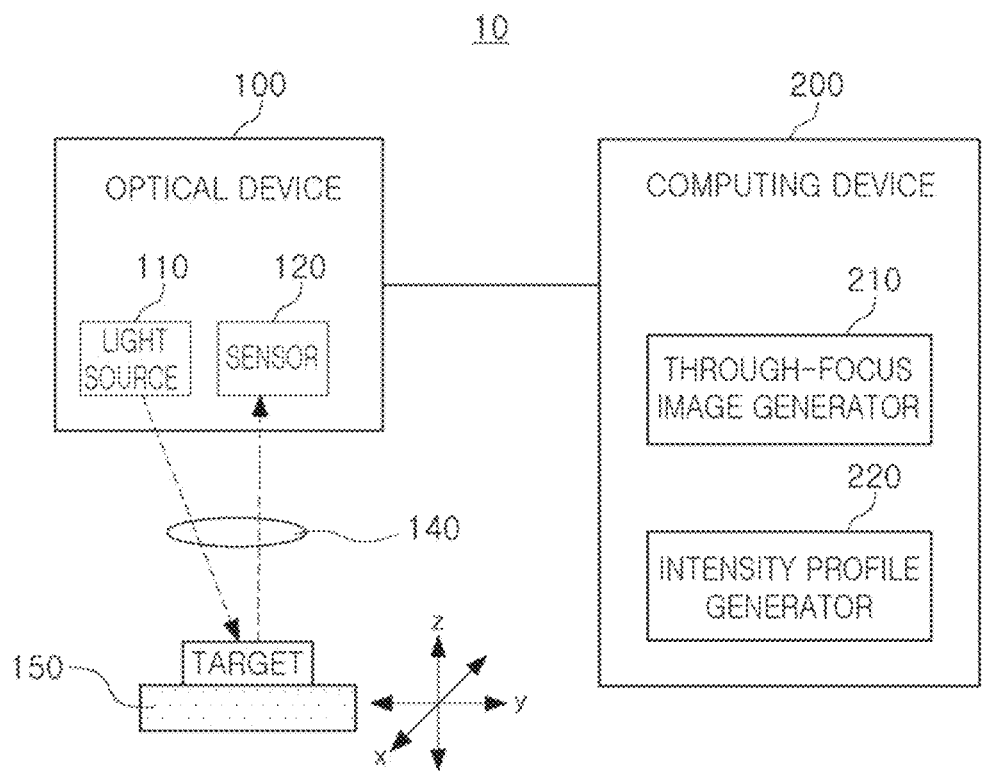
FIG. 1 is a diagram illustrating a through-focus image-based metrology device 10 according to an example embodiment.

FIG. 1 is a diagram illustrating a through-focus image-based metrology device 10 according to an example embodiment. Referring to FIG. 1, a through-focus image-based metrology device 10 may include an optical device 100 and a computing device 200.

The optical device 100 may be configured to provide illumination light to a target and sense an image of the target. The optical device 100 may include an illumination optical system associated with a light source 110 that supplies the illumination light to the target, and an image optical system associated with an image sensor 120 that senses the image of the target. For example, the target may be a wafer level memory chip.

In order to output a through-focus image of the target, the optical device 100 may be configured to move a stage 150 or the image optical system, provided with the target, in at least one direction, for example, an X-axis direction (a first direction), a Y-axis direction (a second direction), or a Z-axis direction (a third direction). In this case, the through-focus image may include an in-focus image or an out-of-focus image, which is out of focus.

In addition, the illumination optical system of the optical device 100 may direct illumination light output from the light source 110 toward the target through an objective lens 140. The image optical system of the optical device 100 may condense reflected light from the target to the image sensor 120 by the objective lens 140. In an example embodiment, the stage 150 may be disposed on a plane formed by an X-axis and a Y-axis. The Z-axis direction may be a direction, perpendicular to the plane formed by the X-axis and the Y-axis. For example, the Z-axis direction may be an optical axis direction of the reflected light, formed by the image sensor 120 and the stage 150.

The computing device 200 may be configured to acquire a plurality of through-focus images from the optical device 100, use the acquired plurality of through-focus images to generate a through-focus image, generate an intensity profile from the through-focus image, and perform metrology related to a target from the generated intensity profile.

The computing device 200 may also be configured to control the optical device 100. For example, the computing device 200 may acquire/collect an image for each step from the optical device 100, while moving the stage 150 or the image optical system of the optical device 100 by one step in at least one direction of the X-axis direction, the Y-axis direction, and the Z-axis direction.

In an example embodiment, the computing device 200 may drive the stage 150 or the optical system of the optical device 100 by one step in the Z-axis direction. The computing device 200 may extract a section image such as a through-focus image for a target in a desired position. In this case, the driving may be set differently, depending on a type of the target.

An optical critical dimension (OCD) metrology device may compare a spectrum simulation result and an actual measured result after structural modeling, to calculate metrology values of a critical dimension (CD) (e.g., a line width)/thickness or the like. Such an OCD metrology device cannot directly measure a non-repetitive object, smaller than an OCD beam size. For example, a thickness of an n-type sub-wordline driver (NSWD) region in a dynamic random access memory (DRAM) cannot be measured directly. In addition, a transmission electron microscopy (TEM) metrology device may destroy a sample such as a wafer to a size and thickness, capable of being captured, to generate a slice specimen of the sample, and perform metrology on the CD/thickness with an electron beam. The TEM metrology devices should destroy the sample for the metrology.

A through-focus image-based metrology device 10 according to an example embodiment may use a through-focus image in a non-destructive manner to directly perform metrology on a non-repetitive pattern structure in a relative narrow region.

Figure 2A:
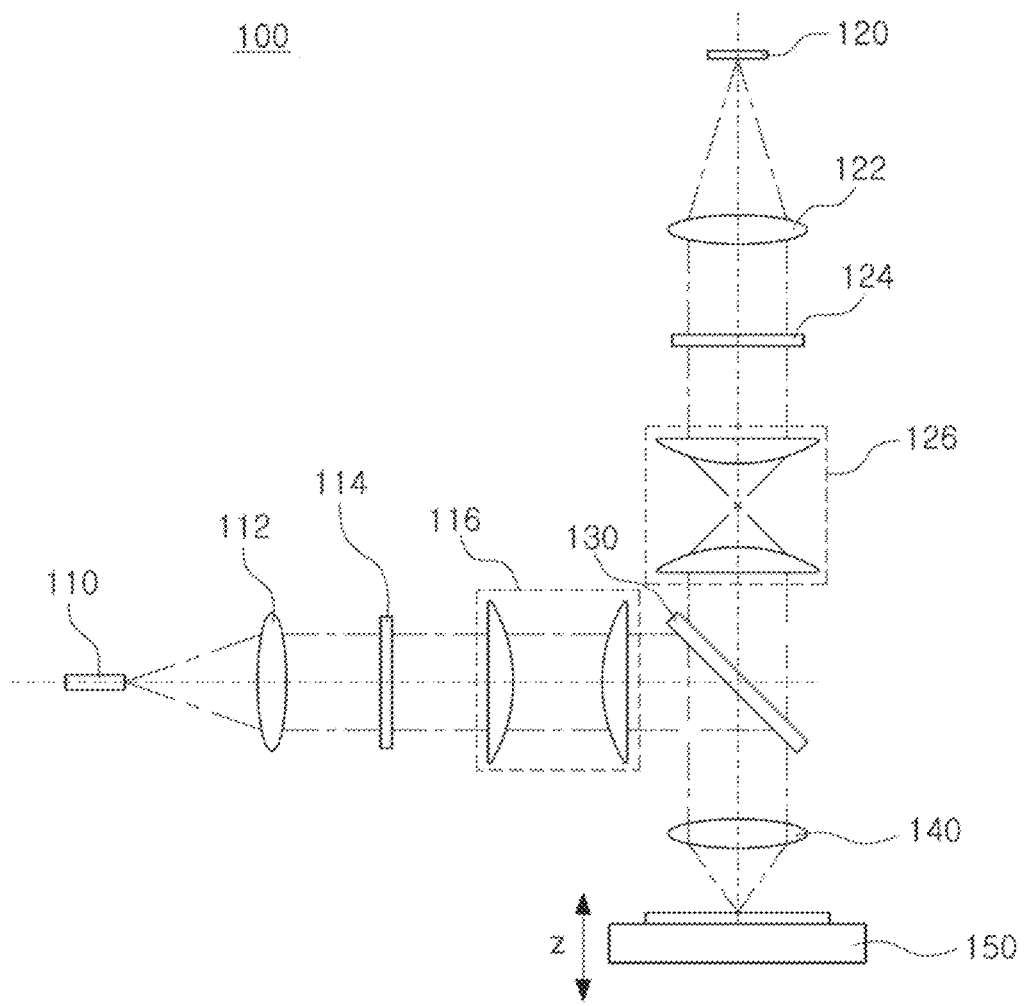
FIG. 2A is a view illustrating an optical device 100 according to an example embodiment.

FIG. 2A is a view illustrating an optical device 100 according to an example embodiment. Referring to FIG. 2A, an optical device 100 may include a light source 110, a collimator 112, an illumination angle adjuster 114, a first relay lens 116, an image sensor 120, a tube lens 122, a reflection angle and phase adjuster 124, a second relay lens 126, a beam splitter 130, an objective lens 140, and a stage 150.

The light source 110 may be configured to emit monochromatic light or broadband light. In an example embodiment, the light source 110 may include, for example, a broad band laser sustained plasma light source, a laser, a supercontinuum laser, a diode laser, a helium neon laser, an argon laser, a solid state laser, a diode pumped solid state (DPSS) laser, a xenon arc lamp, a gas discharge lamp, a light emitting diode (LED) array, or an incandescent lamp.

In an example embodiment, the light source 110 may include at least one spectrum filter that limits a wavelength of light directed to the target. In this case, the spectrum filter may include, for example, a bandpass filter, an edge filter, or a notch filter.

In an example embodiment, the light source 110 may provide light to the target over any suitable range of wavelengths. In an example embodiment, the light output by the light source 110 may include wavelengths in the range of 260 nm to 950 nm. In another example embodiment, the light output by light source 110 may include wavelengths greater than 950 nm to capture defects in structures. However, embodiments of the light source 110 are not limited thereto.

The light source 110 may further include a monochromator that converts broadband light into monochromatic light and outputs the converted light. In this case, the monochromatic light may refer to light having a very short wavelength. For example, the monochromatic light may be light having a wavelength width of about several nanometers (nm). The monochromator may output not only monochromatic light of one wavelength region but also monochromatic lights of a plurality of wavelength regions. For example, the monochromator may output a plurality of monochromatic lights in a predetermined wavelength range. Also, the monochromator may output a plurality of monochromatic lights while sweeping with a preset wavelength width in a predetermined wavelength range.

The collimator 112 may be configured to convert light received from the light source 110 into parallel light. The optical device 100 may further include at least one polarizing optical system for controlling polarization of light output from the collimator 112.

The illumination angle adjuster 114 may be configured to adjust an illumination angle with respect to the target. For example, the illumination angle adjuster 114 may select an incident angle of an illumination beam incident on the target.

The first relay lens 116 may include at least one lens for transmitting light output from the light source 110 to the beam splitter 130.

The image sensor 120 may be disposed on the objective lens 140. The image sensor 120 may be disposed on an optical axis of reflected light reflected from the target. The optical axis of the image optical system may extend in the third direction (the Z-axis direction). The image sensor 120 may sense an image of the target using the reflected light. The image sensor 120 may be a charge coupled device (CCD), a complementary metal-oxide-semiconductor (CMOS) image sensor, or the like.

In an example embodiment, the image sensor 120 may include a plurality of pixels arranged in matrix form. A resolved distance of the image sensor 120 may be inversely proportional to the numerical aperture (NA) of the objective lens 140, and may be proportional to a wavelength of the reflected light, for example, $R=K\lambda/NA$, where R is a resolved distance of the image sensor 120, $K=0.5$, and NA is the numerical aperture of the objective lens 140. When the reflected light has a wavelength ($\lambda$) of about 200 nm and the objective lens 140 has a numerical aperture (NA) of about 0.92, the image sensor 120 may have a resolved distance capable of discriminating images of about 108 nm or more in width.

In addition, sensitivity of the image sensor 120 may be the same as an incident angle $\theta$ of illumination light incident on the target by the objective lens 140, for example, $NA = n \sin \theta$, where NA is the numerical aperture of the objective lens 140, n is a refractive index of air (n=1), and $\theta$ is an incident angle. When the numerical aperture (NA) of the objective lens 140 is 0.92, sensitivity of the image sensor 120 and an incident angle $\theta$ of the illumination light may be 66.66, respectively.

The tube lens 122 may be configured to form an intermediate image from reflected light, that has passed through the second relay lens 126, and transmit the intermediate image into the image sensor 120.

The reflection angle and phase adjuster 124 may be configured to select an angle of reflected light to acquire an image of the target, or the reflection angle and phase adjuster 124 may be configured to adjust a phase of a reflection angle.

The reflection angle and phase adjuster 124 may include a reflection angle adjuster that adjusts an angle of reflected light received from the image sensor 120, and a phase modulator that performs a phase modulation function of the reflected light. In this case, the phase modulator may perform a function of amplifying intensity of a through-focus signal.

The second relay lens 126 may include at least one lens for transmitting reflected light reflected from the target to the image sensor 120.

The beam splitter 130 may be configured to reflect a portion of light incident from the first relay lens 116 to the target, or to reflect a portion of reflected light reflected from the target to the second relay lens 126. Although the optical system of the optical device 100 illustrated in FIG. 2A may include the beam splitter 130, embodiments of the optical system are not limited thereto. The optical system according to example embodiments may be implemented without the beam splitter.

The objective lens 140 may include at least one lens. The objective lens 140 may condense light to the target, or, conversely, may convert reflected light from the target into parallel light and output the converted light. In an example embodiment, the objective lens 140 may enlarge and project the target onto the image sensor 120. For example, the objective lens 140 may have the numerical aperture (NA) of about 0.92.

The stage 150 may be configured to move the target in the Z-axis direction under control of a computing device 200, to acquire a target image. To acquire the target image, the stage 150 may be moved in the Z-axis direction under the control of the computing device 200, but embodiments are not limited thereto. According to example embodiments, other optical systems, for example, an illumination optical system or an image optical system on a fixed stage along the Z-axis may be driven, to acquire a target image.

Light emitted from the light source 110 may pass through the collimator 112, the first relay lens 114, and the beam splitter 130, and may be collected by being radiated into the objective lens 140 or the like. The light that has passed through the objective lens 140 may be reflected by the target, may pass through the objective lens 140 and the beam splitter 130 again, may pass through the second relay lens 126, and may be condensed on the image sensor 120 by the tube lens 122. In this case, the target may be imaged on the image sensor 120. In this case, a first angular distribution surface may be formed by the collimator 112. Angular distribution of illumination may be adjusted by installing an angular distribution selector, for example, an illumination angle adjuster 114, on an illumination side at a position of the first angular distribution surface. In addition, a second angular distribution surface may be formed by the second relay lens 126. Angular distribution of collecting ray may be adjusted by installing an angular distribution selector on an image side at a position of the second angular distribution surface. In addition, a phase modulator may be installed at a position of the second angular distribution surface, to select the angular distribution and shift a phase of the desired angular component. The shift in phase of the reflected light may increase intensity of a through-focus signal acquired to generate a through-focus image.

The illumination optical system of the optical device 100 illustrated in FIG. 2A may further include a polarizer, for example, a horizontal polarizer or a vertical polarizer.

The illumination optical system of the optical device 100 illustrated in FIG. 2A may include the illumination angle adjuster 114 and the first relay lens 116. However, embodiments are not limited thereto, and an illumination optical system of an optical device according to an embodiment may not include an illumination angle adjuster and a first relay lens.

Figure 2B:
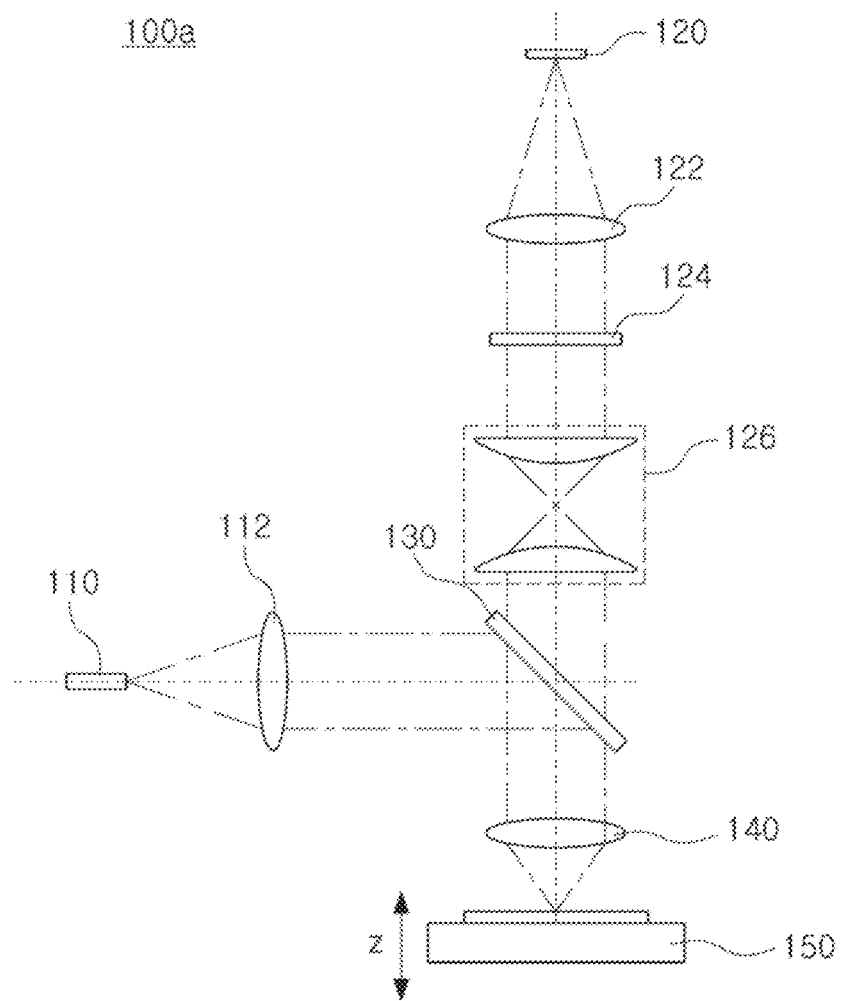
FIG. 2B is a view illustrating an optical device 100a according to another example embodiment.

FIG. 2B is a view illustrating an optical device 100a according to another example embodiment. Referring to FIG. 2B, an optical device 100a may be implemented as an illumination optical system that does not include the illumination angle adjuster 114 and the first relay lens 116, as compared to the optical device 100 illustrated in FIG. 2A.

The first relay lens 116 of the illumination optical system illustrated in FIG. 2A may be implemented by lenses arranged to face each other. However, it should be understood that a first relay lens of an illumination optical system according to embodiments are not limited thereto.

Figure 2C:
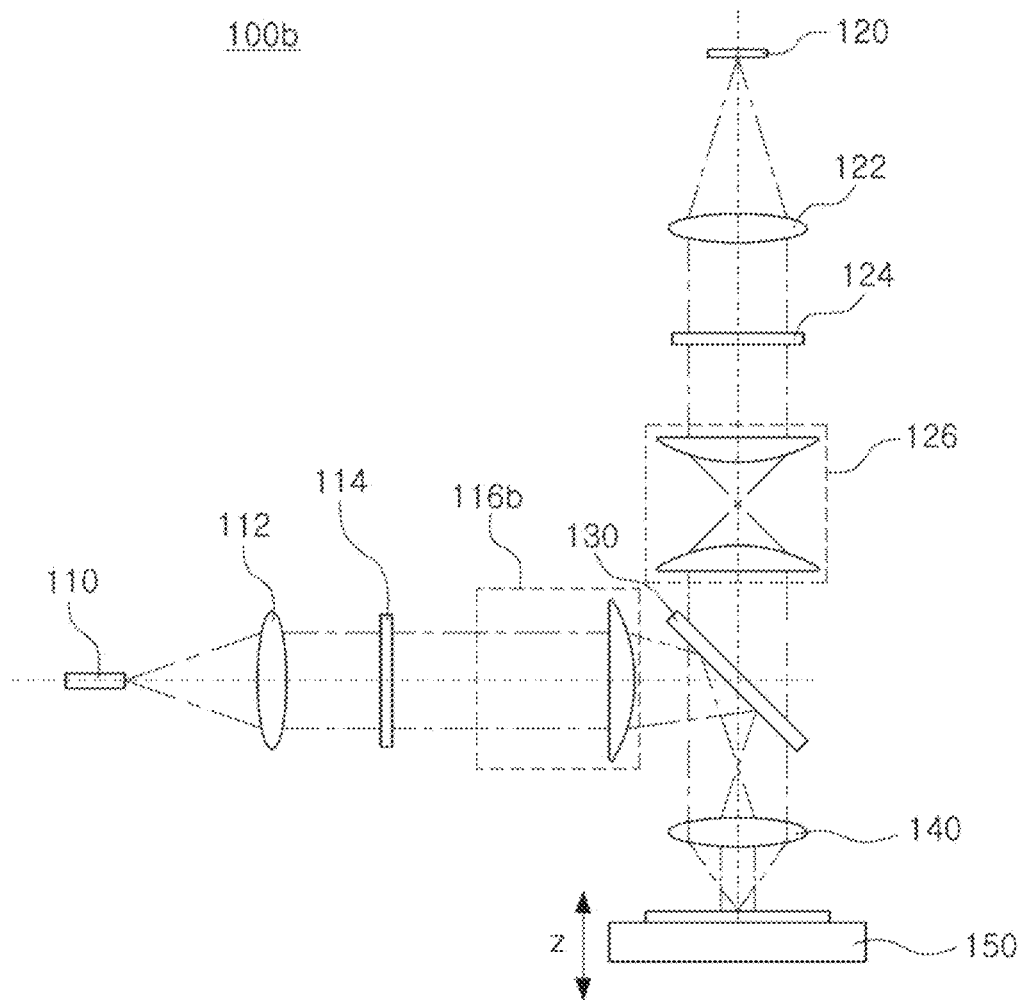
FIG. 2C is a view illustrating an optical device 100b according to another example embodiment.

FIG. 2C is a view illustrating an optical device 100b according to another example embodiment. Referring to FIG. 2C, an optical device 100b may be implemented as an illumination optical system having a first relay lens 116b configured with a single lens, in a different manner to the first relay lens 116 configured with lenses arranged to face each other, illustrated in FIG. 2A.

Figure 3:
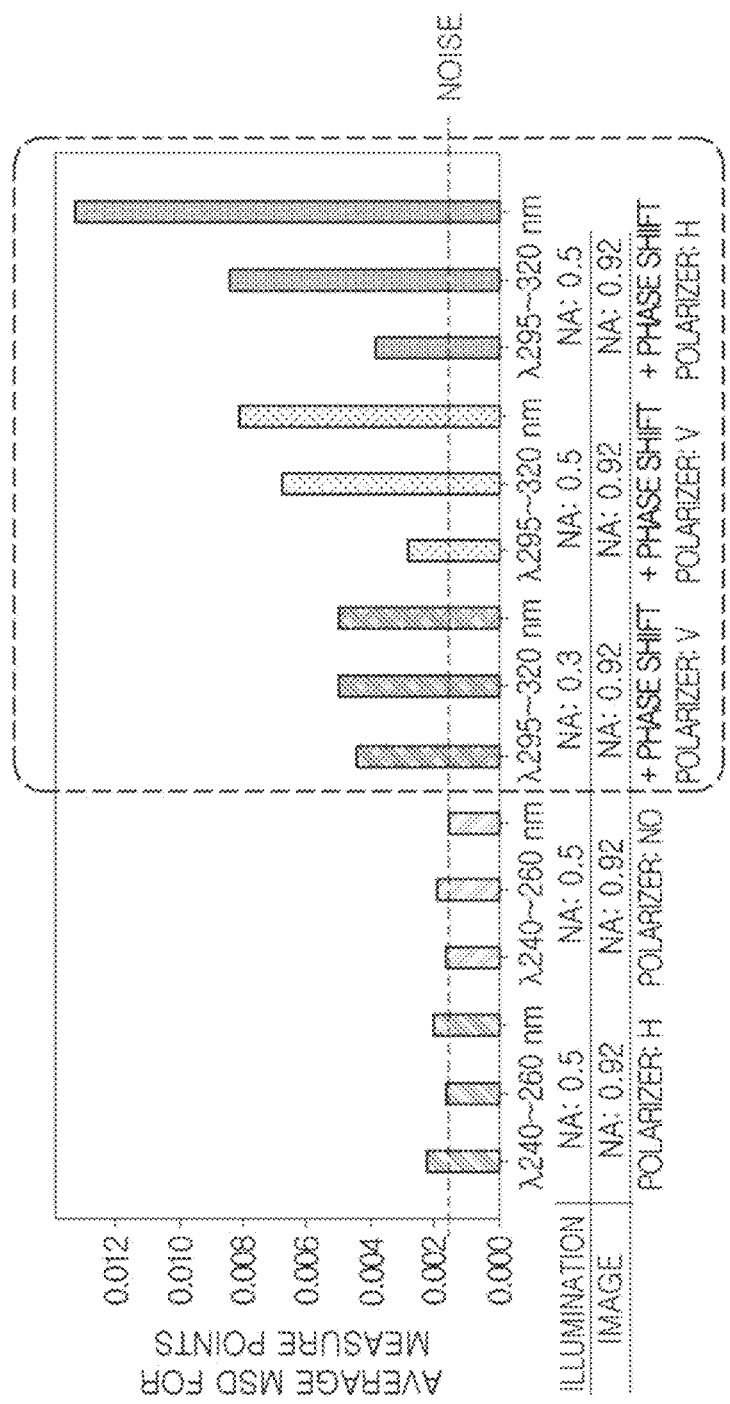
FIG. 3 is a view illustrating an effect of a phase modulator according to an example embodiment.

FIG. 3 is a view illustrating an effect of a phase modulator of the reflection angle and phase adjuster 124, according to an example embodiment. When adding a shift in phase by a reflection angle and phase modulation of a reflection angle and phase adjuster 124, a shift amount in phase of a desired angular component may be controlled.

A through-focus image signal below noise may be sensed in an optical system having a light source of a first wavelength (240 nm to 260 nm), the numerical aperture (NA) of illumination of 0.5, the numerical aperture (NA) of image of 0.92, and a horizontal polarizer H. In addition, a through-focus image signal below noise may be sensed in an optical system having a light source of a first wavelength (240 nm to 260 nm), the numerical aperture (NA) of illumination of 0.5, and the numerical aperture (NA) of image of 0.92, without using a polarizer.

A through-focus image signal identical to or higher than noise may be sensed in an optical system having a light source of a second wavelength (295 nm to 320 nm), the numerical aperture (NA) of illumination of 0.3, the numerical aperture (NA) of image of 0.92, a vertical polarizer V, and a shift in phase. In addition, a through-focus image signal identical to or higher than noise may be sensed in an optical system having a light source of a second wavelength (295 nm to 320 nm), the numerical aperture (NA) of illumination of 0.5, the numerical aperture (NA) of image of 0.92, a vertical polarizer V, and a shift in phase. In addition, a through-focus image signal identical to or higher than noise may be sensed in an optical system having a light source of a second wavelength (295 nm to 320 nm), the numerical aperture (NA) of illumination of 0.5, the numerical aperture (NA) of image of 0.92, a vertical polarizer H, and a shift in phase.

As illustrated in FIG. 3, when a shift in phase is added, intensity of a through-focus image signal with respect to a change in CD/thickness may be amplified. For example, when using a phase modulator, a received through-focus image signal may be measured as being identical to or higher than noise.

Figure 4A:
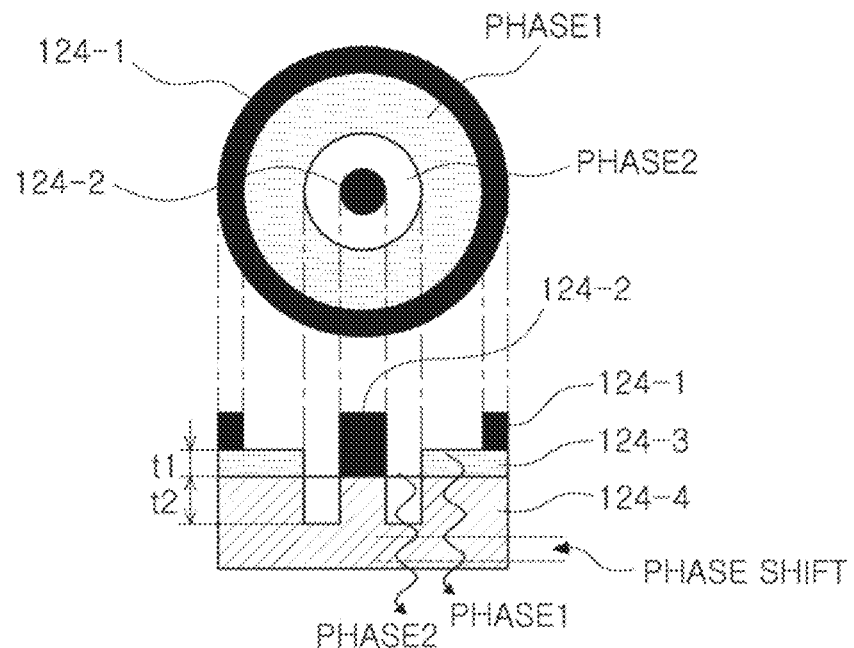
FIG. 4A is a view illustrating a phase modulator according to an example embodiment.

FIG. 4A is a view illustrating a phase modulator according to an example embodiment. Referring to FIG. 4A, a phase modulator may include shields 124-1 and 124-2 through which reflected light may be not transmitted, a coating material 124-3, and a substrate 124-4. In this case, the phase modulator may be implemented by disposing the translucent materials 124-1 and 124-2 or the coating material 124-3 on the substrate 124-4.

In an example embodiment, a shift in phase that is an absolute value of a difference in phase between PHASE1 and PHASE2 may be controlled by adjusting a coating thickness t1 or a thickness t2 of the substrate.

FIG. 4A is a view illustrating a difference in phase of a phase modulator according to an example embodiment. Referring to FIG. 4A, a shift in phase in a phase modulator installed on a Fourier surface may be an absolute value acquired by subtracting PHASE2 from PHASE1'.

Figure 4B:
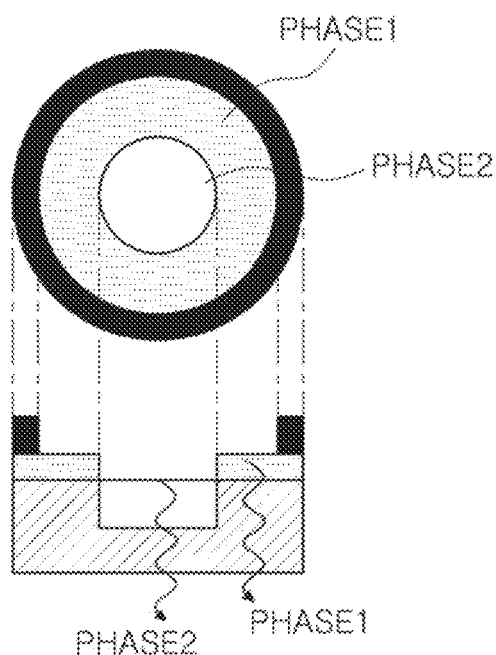
FIG. 4B is a view illustrating a phase modulator according to an example embodiment.

FIG. 4B is a view illustrating a phase modulator according to an example embodiment. Referring to FIG. 4B, a phase modulator may not include a diaphragm in a central portion, as compared to that of FIG. 4A.

The illumination system of the optical device 100 illustrated in FIGS. 2A and 2B may be implemented with a single light source 110. However, a through-focus image-based metrology device according to embodiments are not limited thereto. An illumination system of an optical device according to example embodiments may be also implemented with at least two light sources.

Figure 5:
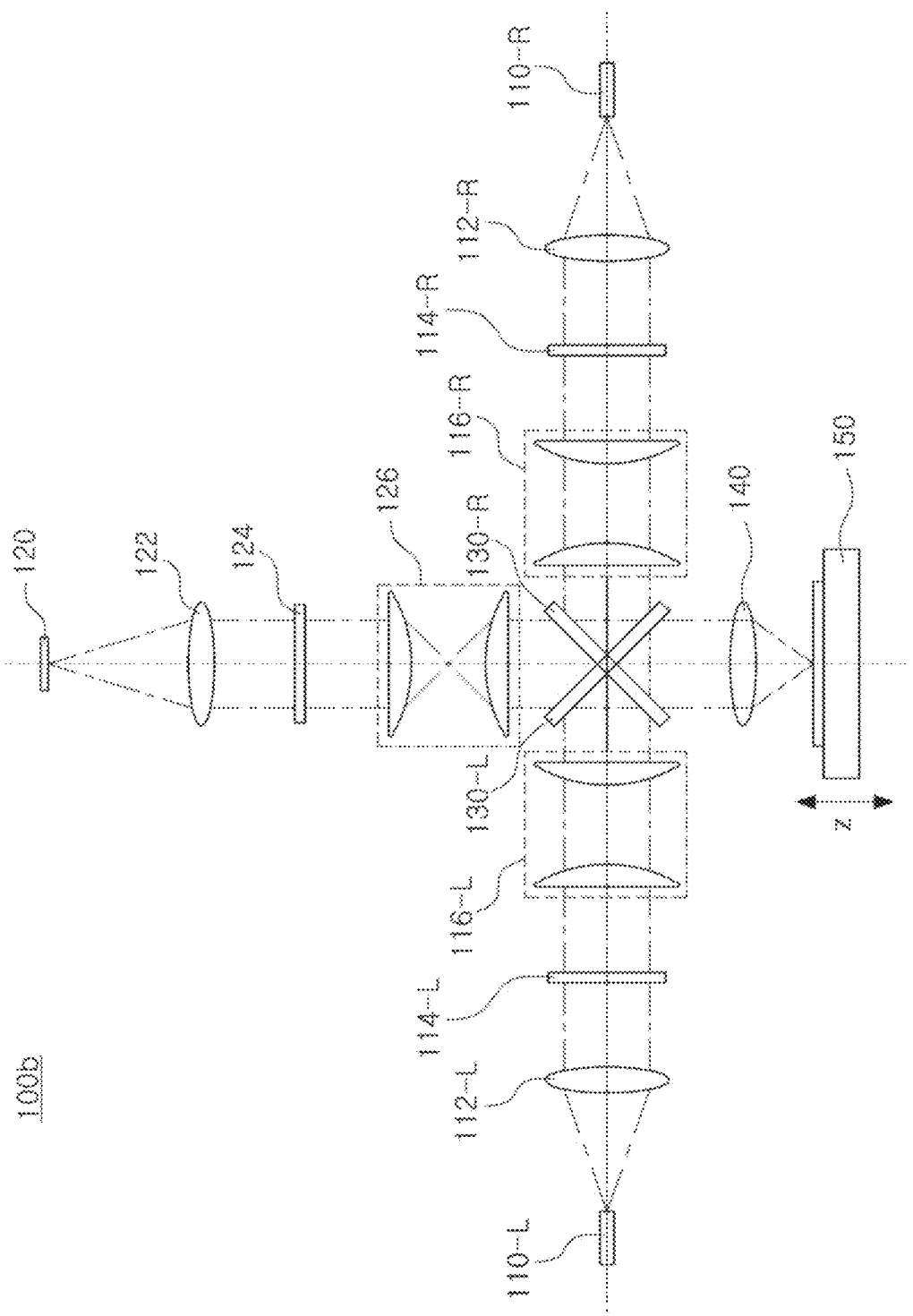
FIG. 5 is a view illustrating an optical device 100b according to another example embodiment.

FIG. 5 is a view illustrating an optical device 100b according to another example embodiment. Referring to FIG. 5, an optical device 100b may have differences implemented with two light sources 110-L and 110-R, as compared to the optical devices 100 and 100a illustrated in FIGS. 2A and 2B, respectively.

The optical device 100a may include a left light source 110-L, a left collimator 112-L, a left light source angle adjuster 114-L, a left first relay lens 116-L, a right light source 110-R, a right collimator 112-R, a right light source angle adjuster 114-R, a right first relay lens 116-R, an image sensor 120, a tube lens 122, a reflection angle and phase adjuster 124, a second relay lens 126, a left beam splitter 130-L, a right beam splitter 130-R, an objective lens 140, and a stage 150.

Figure 6:
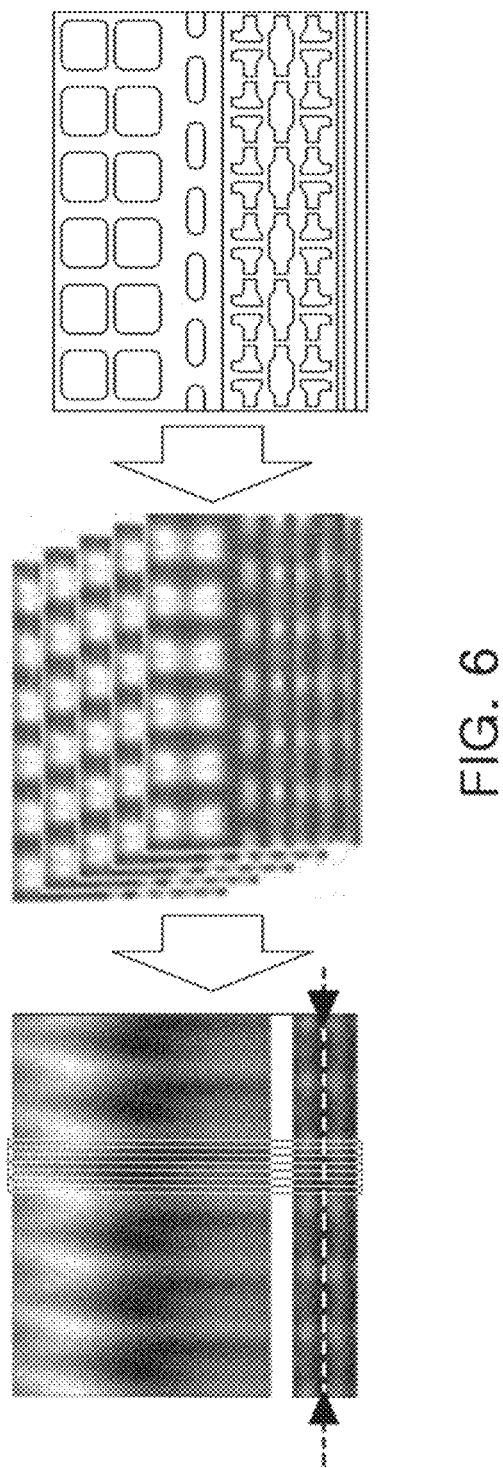
FIG. 6 is a diagram illustrating a process of acquiring a through-focus image in a through-focus image-based metrology device 10 according to an example embodiment.

FIG. 6 is a diagram illustrating a process of acquiring a through-focus image in a through-focus image-based metrology device 10 according to an example embodiment.

The optical device 100 of FIG. 1 may perform scanning in the Z-axis direction with respect to a predetermined region of interest, for example, an NSWD region of a DRAM of a target. While moving the stage or the optical system in the Z-axis direction, a plurality of through-focus images may be acquired. For example, a plurality of through-focus images may be acquired by Z-scanning.

The through-focus image generator 210 of the computing device 200 in FIG. 1 may use acquired through-focus images to generate a through-focus image. For example, the computing device 200 may acquire a through-focus image for a portion of the target, for example, lines having various widths of an upper portion, heights, and inclination angles. At this time, since many through-focus images for the target are required, acquisition of characteristic through-focus image may be used. In an example embodiment, a through-focus image may be acquired by acquiring images from a plurality of different focal positions in the optical device 100 for acquiring a through-focus image for each target, and then combining and processing the acquired image in terms of light intensity or color values.

In another example embodiment, actual images of a target of a small number, for example, three or five, of focal positions in some focal positions may be obtained, and the obtained images and information on focal positions at which each of the images is obtained may be acquired. Based on the actual images and a degree of out-of-focus of each of the actual images, the actual images and the focal positions may be differentiated to acquire a plurality of virtual images and their focal positions, and these actual images and virtual images may be combined and processed in terms of light intensity or color value to acquire a through-focus image of the target.

In an example embodiment, an interpolation method based on actual images at a plurality of different focal positions and a focal position of each of the actual images may be used to acquire a plurality of virtual images, different from the actual images, and their focal positions.

Figure 7:
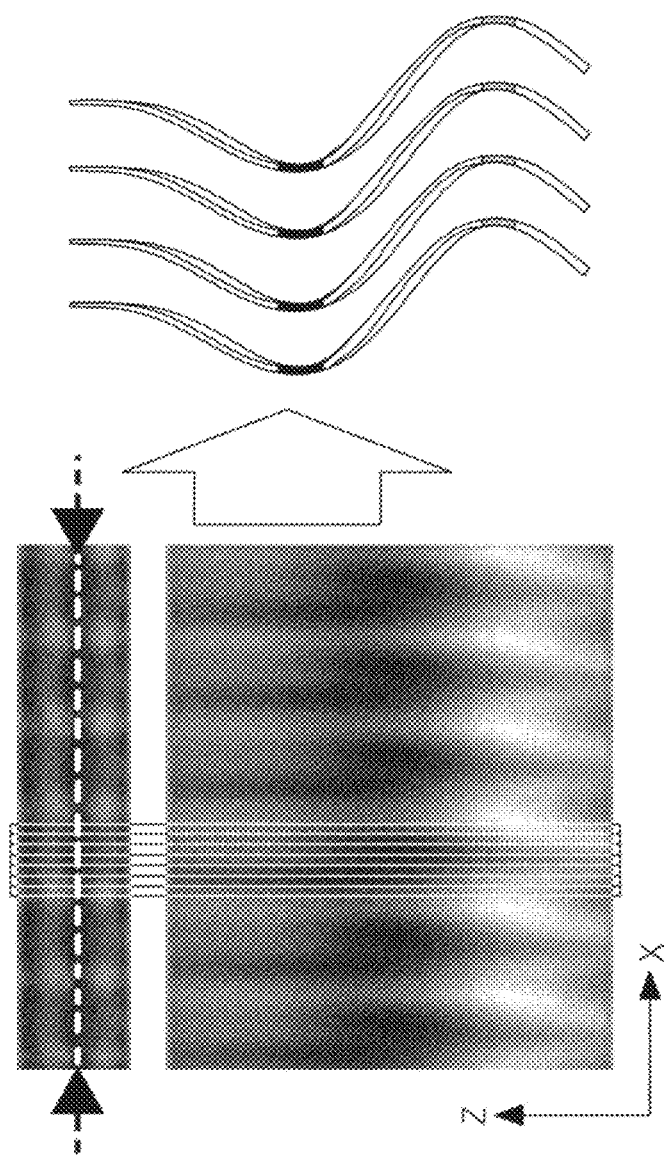
FIG. 7 is a diagram illustrating a process of extracting an intensity profile from a through-focus image according to an example embodiment.

FIG. 7 is a diagram illustrating a process of extracting an intensity profile from a through-focus image according to an example embodiment. Referring to FIG. 7, a through-focus image may divide a plurality of segments in the X-axis direction. Each of the segments may be averaged in the Z-axis direction to generate an intensity profile for each of the segments. In an example embodiment, the number of segments may be at least one.

In an example embodiment, the intensity profile and a learning model may be used to generate metrology data. In another example embodiment, differences in intensity profiles may be quantified, without a learning model, to generate metrology data.

Figure 8A:
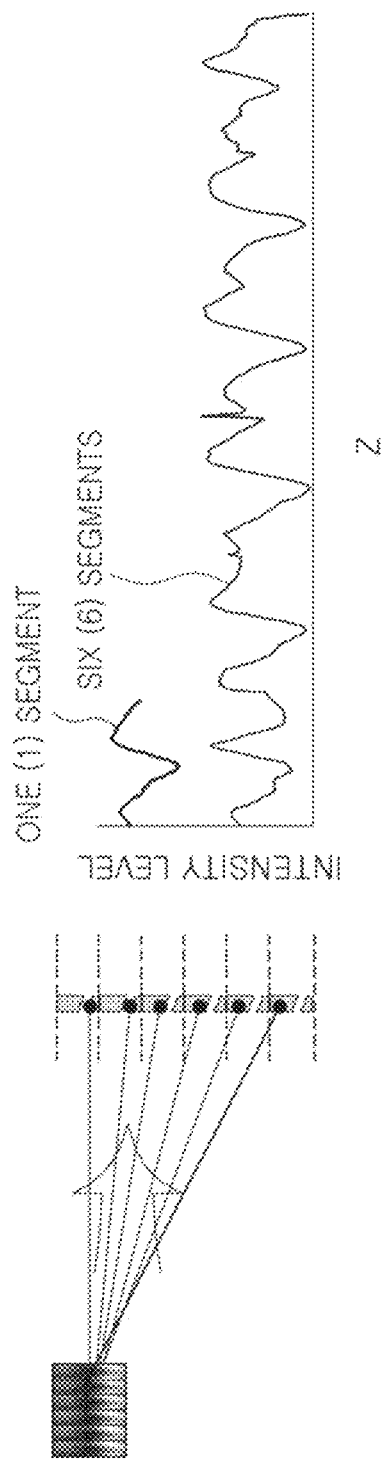
FIG. 8A is a diagram illustrating a process of generating an intensity profile, depending on the number of segments according to an example embodiment.

FIG. 8A is a diagram illustrating a process of generating an intensity profile, depending on the number of segments, according to an example embodiment. FIG. 8A illustrates an intensity profile extracted when there is one (1) segment and an intensity profile extracted when there are six (6) segments. As illustrated in FIG. 8A, as the number of segments increases, an amount of information in the X-axis direction may increase.

Figure 8B:
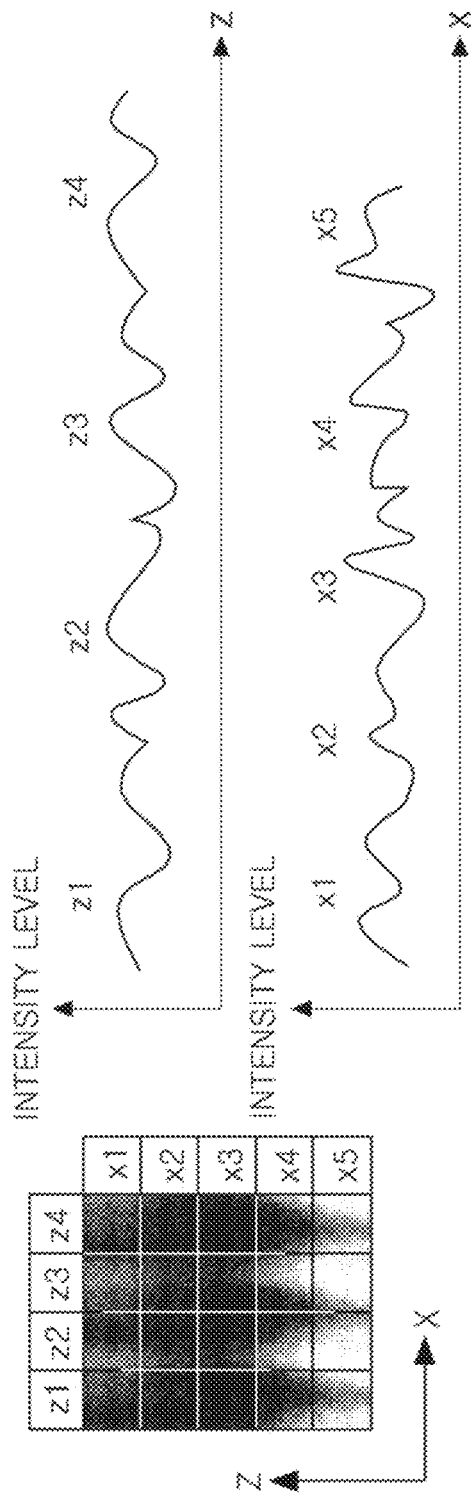
FIG. 8B is a diagram illustrating a process of generating an intensity profile, depending on the number of segments according to another example embodiment.

FIG. 8B is a diagram illustrating a process of generating an intensity profile, depending on the number of segments, according to another example embodiment. Referring to FIG. 8, an intensity profile in the Z-axis direction may be generated by z1, z2, z3, and z4. In addition, an intensity profile in the X-axis direction may be generated by x1, x2, x3, x4, and x5.

In an example embodiment, an intensity profile may be generated as at least one intensity profile in the X-axis direction. An intensity profile according to another example embodiment may be generated as at least one intensity profile in the Y-axis direction. In another example embodiment, an intensity profile may be generated by at least one intensity profile in the X-axis direction and at least one intensity profile in the Y-axis direction.

An intensity profile according to an example embodiment of may be generated by at least one intensity profile in the X-axis direction, at least one intensity profile in the Y-axis direction, or at least one intensity profile in the Z-axis direction.

Figure 9:
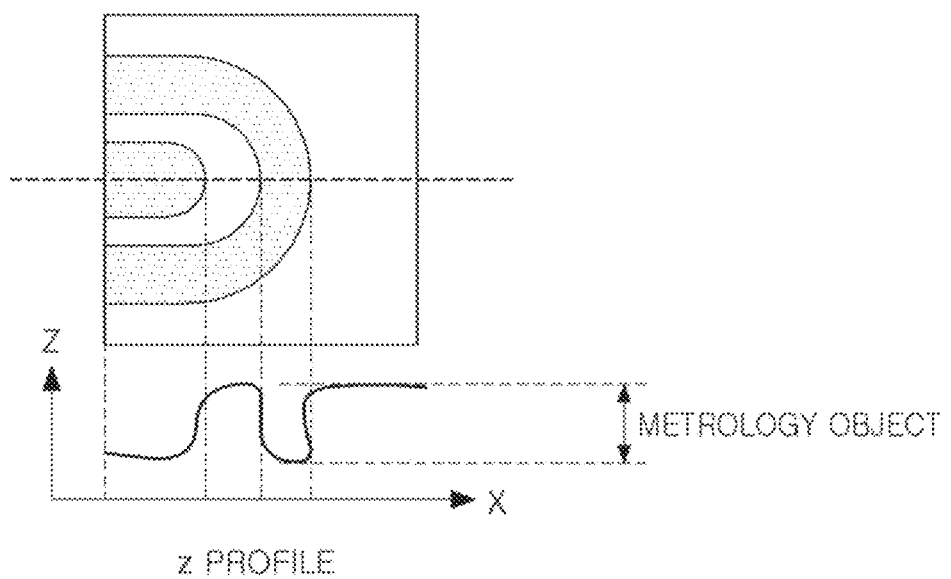
FIG. 9 is a view illustrating generation of reference data by an atomic force microscope (AFM) for height metrology according to an example embodiment.

FIG. 9 is a view illustrating generation of reference data by an atomic force microscope (AFM) for height metrology according to an example embodiment. Referring to FIG. 9, in actual metrology, there may be various metrology objects such as a height, a thickness, a critical dimension (CD), and a slope. In an example embodiment, reference data may be acquired by various methods, such as simulation, atomic force microscope (AFM) metrology, optical critical dimension (OCD) metrology, or the like.

Figure 10:
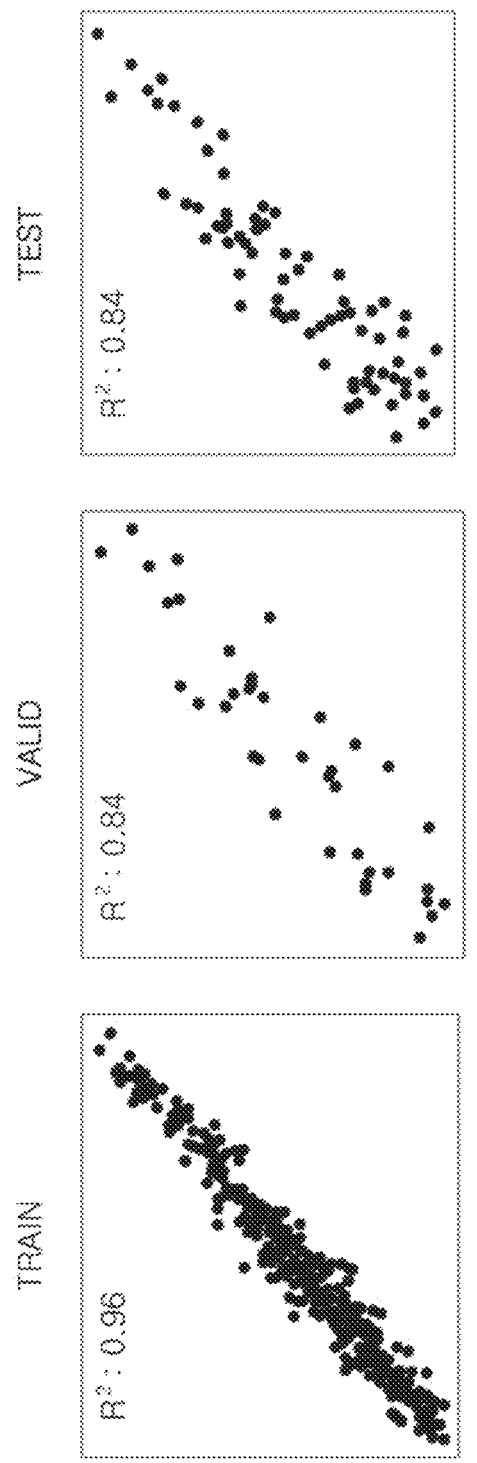
FIG. 10 is a view illustrating learning consistency for extracting an intensity profile according to an example embodiment.

FIG. 10 is a view illustrating learning consistency for extracting an intensity profile according to an example embodiment. Referring to FIG. 10, in order to generate a learning model, learning may be divided into and performed as a training set, a validation set, and a test set. In general, a model may be trained using the training set, accuracy of prediction and classification of the model may be verified using the validation set, and the model may be tested using the test set. In an example embodiment, consistency of training may be confirmed with the test set. For example, as illustrated in FIG. 10, cross validation score may be maximum when $R^2=1$. Generally, it may be used for mass production when $R^2$ is 0.8 or higher.

Figure 11A:
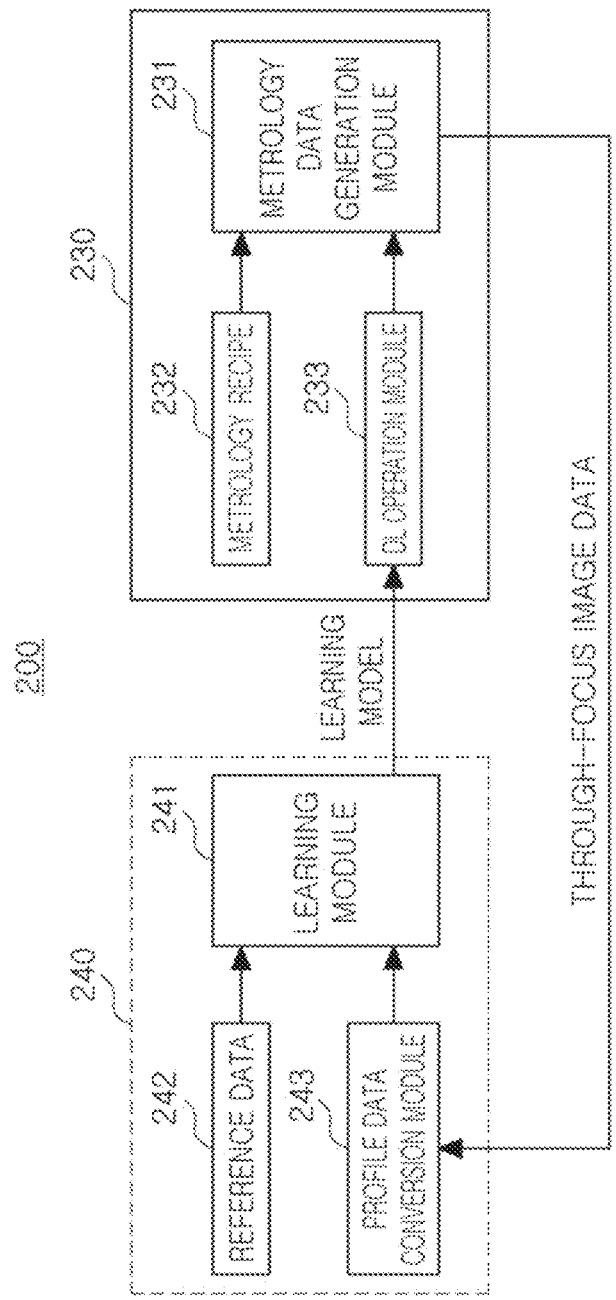
FIG. 11A is a diagram illustrating a process of generating an initial learning model in a computing device according to an example embodiment.

FIG. 11A is a diagram illustrating a process of generating an initial learning model in a computing device 200 including at least one processor according to an example embodiment. Referring to FIG. 11A, at least one processor included in a computing device 200 may implement a metrology data generator 230 and a learning model generator 240.

The metrology data generator 230 may include a metrology data generation module 231, a metrology recipe 232, and a deep learning (DL) operation module 233. The metrology recipe 232 may include a recipe for a Z-axis driving range or a step interval to acquire a through-focus image, and a recipe for a position and a method of extracting an intensity profile. The learning model generator 240 may be configured to create a learning model by receiving through-focus image data from the metrology data generation module 231 to be converted into intensity profile data, and using an artificial neural network or deep learning to learn reference data and the intensity profile data. In an example embodiment, the artificial neural network may be a convolutional neural network (CNN), a recurrent neural network (RNN), a restricted Boltzmann machine (RBM), a deep belief network (DBN), or the like.

A profile data conversion module 243 may receive through-focus image data from the metrology data generation module 231 to generate a learning model, and may generate an intensity profile. In an example embodiment, the through-focus image data may be received from the metrology data generator 230 only once for the first time when a learning model is generated.

In addition, the learning model generator 240 may include a learning module 234 and a profile data conversion module 243. The learning module 234 may generate a learning model using reference data and intensity profile data. In this case, the reference data may include AFM data.

The learning module 234 illustrated in FIG. 11A may be included in the computing device 200. However, embodiments are not limited thereto. A learning module according to example embodiments may be implemented by a device, other than the computing device 200.

Figure 11B:
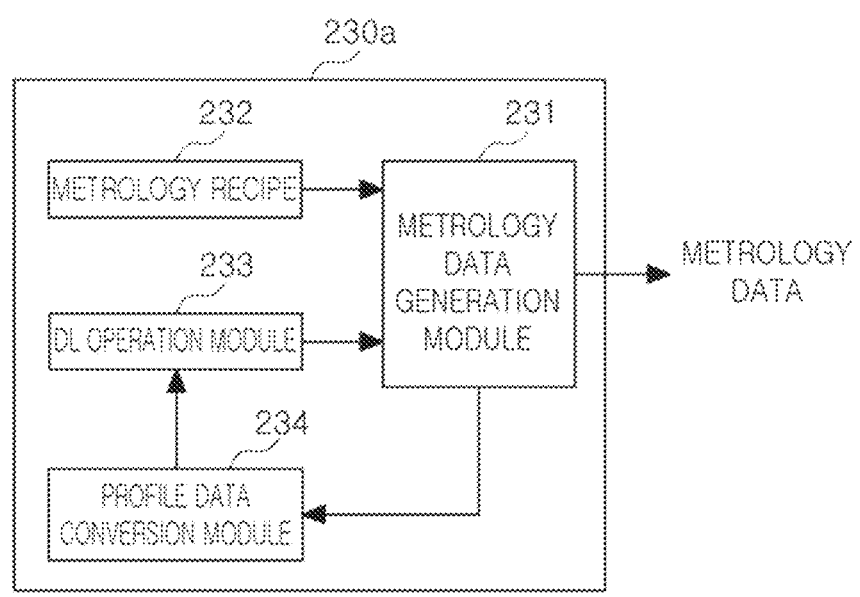
FIG. 11B is a diagram illustrating a metrology data generation module generating metrology data in a computing device according to an example embodiment.

FIG. 11B is a diagram illustrating a metrology data generation module 230a generating metrology data in a computing device 200 according to an example embodiment. Referring to FIG. 11B, a metrology data generation module 231a may control an optical system and a stage 150 with a metrology recipe 232 to acquire a through-focus image, and may then generate an intensity profile, and a deep learning (DL) operation module 233 may learn a learning model and the intensity profile to generate metrology data.

The metrology data generation module 231a may use the metrology recipe 232 and the learning model of the DL operation module 233 to generate metrology data for a target. In this case, the metrology recipe 232 may include an intensity profile extracted from a through-focus image with respect to the target.

In an example embodiment, the metrology data generation module 231a may separate the influence of at least one process variation on metrology performance by providing metrology values of a plurality of recipes or metrology targets in a manufacturing line. In an example embodiment, the metrology data generation module 231 may use different recipes. For example, a first recipe that may be robust to process variations may be used for overlay measurement. In addition, a second recipe sensitive to process variations may be used for fundamental cause analysis. A metrology target or recipe associated with the metrology data generation module 231 may perform automatic recipe optimization.

In an example embodiment, the metrology data generation module 231a may control the optical system and the stage 150 in FIG. 1 with the metrology recipe 232 to acquire a through-focus image, and may then generate an intensity profile. the intensity profile may be input into the DL operation module 233 to generate metrology data. A through-focus image-based metrology device 10 according to an example embodiment may be implemented by modifying hardware of a bright field (BF) facility and adding software. For example, as described in FIG. 2A, a phase modulator may be added, an intensity profile may be generated, and the generated intensity profile and a learning model may be used to determine a measured value of a target.

A through-focus image-based metrology device 10 according to an example embodiment may control an optical system and a through-focus image generation system, may extract an intensity profile, may generate a metrology value with a pre-generated learning model, and may quantify a difference in profile without a learning model, to generate a distribution map identical to or higher than the profile.

In a through-focus image-based metrology device 10 according to an example embodiment, light reflected from a target, for example, an object, may be used to change an intensity profile in a defocus region, not an on-focus region, due to structural changes such as CD/thickness of the target or the like, to calculate a metrology value.

A through-focus image-based metrology device 10 according to an example embodiment may perform metrology for an object that may be much smaller than an OCD beam size, regardless of being repetitive or non-repetitive. For example, a metrology resolution may have a resolution corresponding to a pixel size of an optical system. For example, a metrology resolution may be a 23.3 nm resolution. This may allow direct metrology for a change in DRAM GOx Dent structure.

Figure 12:
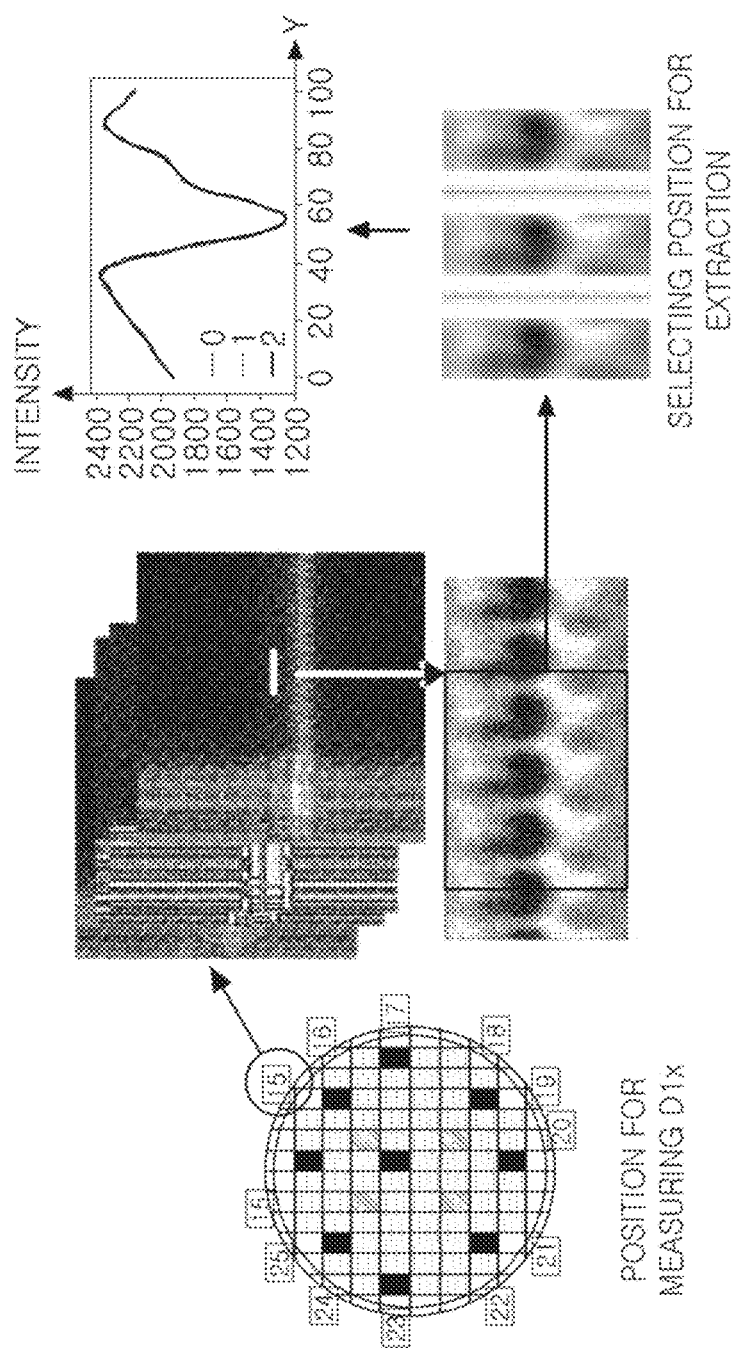
FIG. 12 is a diagram illustrating a process of acquiring an intensity profile according to an example embodiment.

FIG. 12 is a diagram illustrating a process of acquiring an intensity profile according to an example embodiment. Referring to FIG. 12, a one-dimensional array of intensities extracted from a through-focus image may be obtained. Information about changes in CD and thickness is illustrated as a change in intensity at a defocus position in the through-focus image. An intensity profile may be extracted from the through-focus image, to use the change in intensity as a spectrum for a wavelength. The intensity profile may be learned to extract metrology values from the through-focus image. This intensity profile extraction technique may use existing base tools for learning a spectrum for a wavelength as they are.

Figure 13:
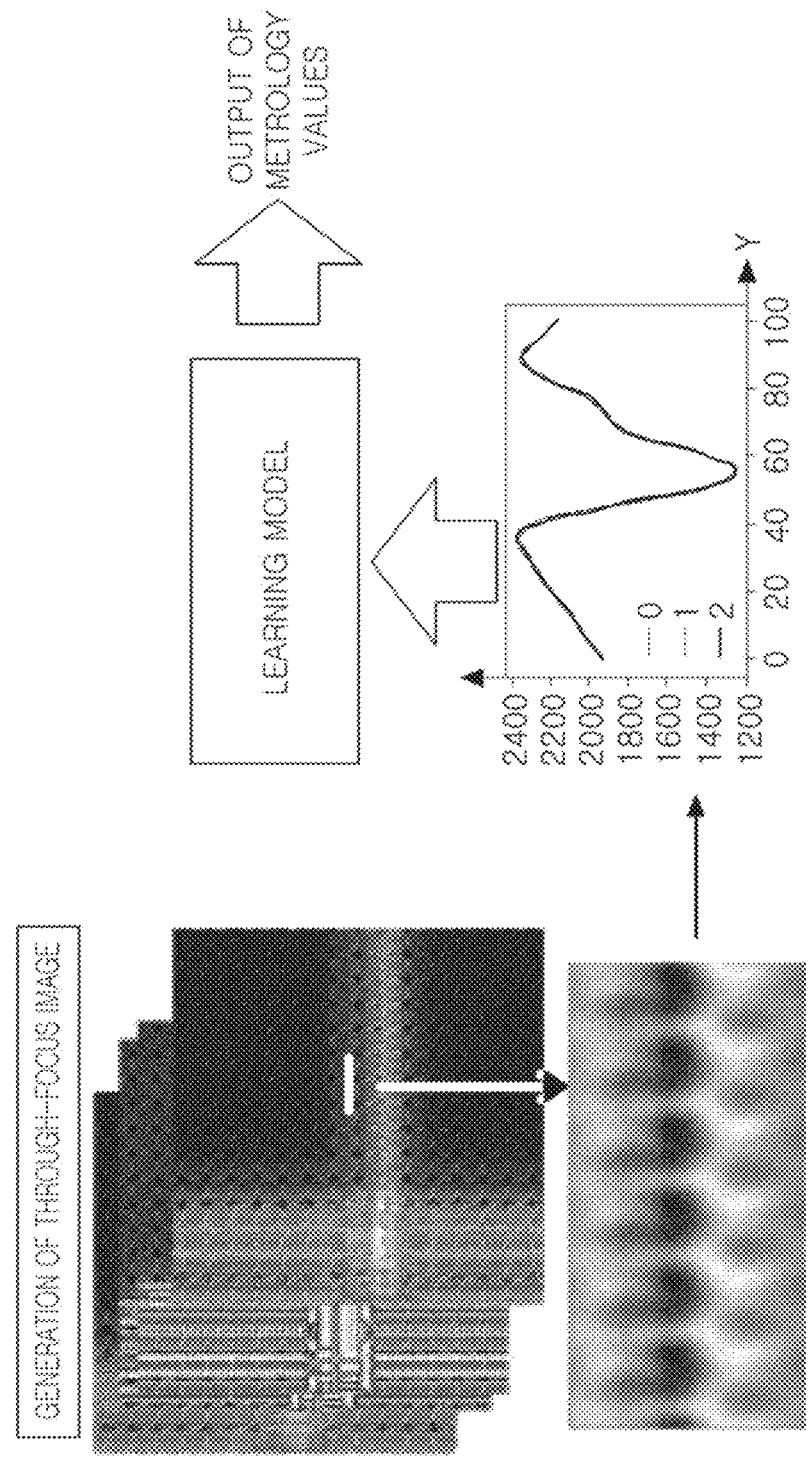
FIG. 13 is a diagram conceptually illustrating a process of outputting metrology data using a learning model according to an example embodiment.

FIG. 13 is a diagram conceptually illustrating a process of outputting metrology data using a learning model according to an example embodiment. Referring to FIG. 13, after generating a through-focus image, an intensity profile may be extracted from segments for a specific region, and an arithmetic operation of the extracted intensity profile may be performed in a learning module, to output metrology data.

In an example embodiment, positions for extracting an intensity profile may be selected from through-focus images. As illustrated in FIG. 13, a one-dimensional arrangement, for example, an intensity profile, may be generated by averaging through-focus images at each of the selected positions for extracting an intensity profile in the Y-axis direction.

Figure 14:
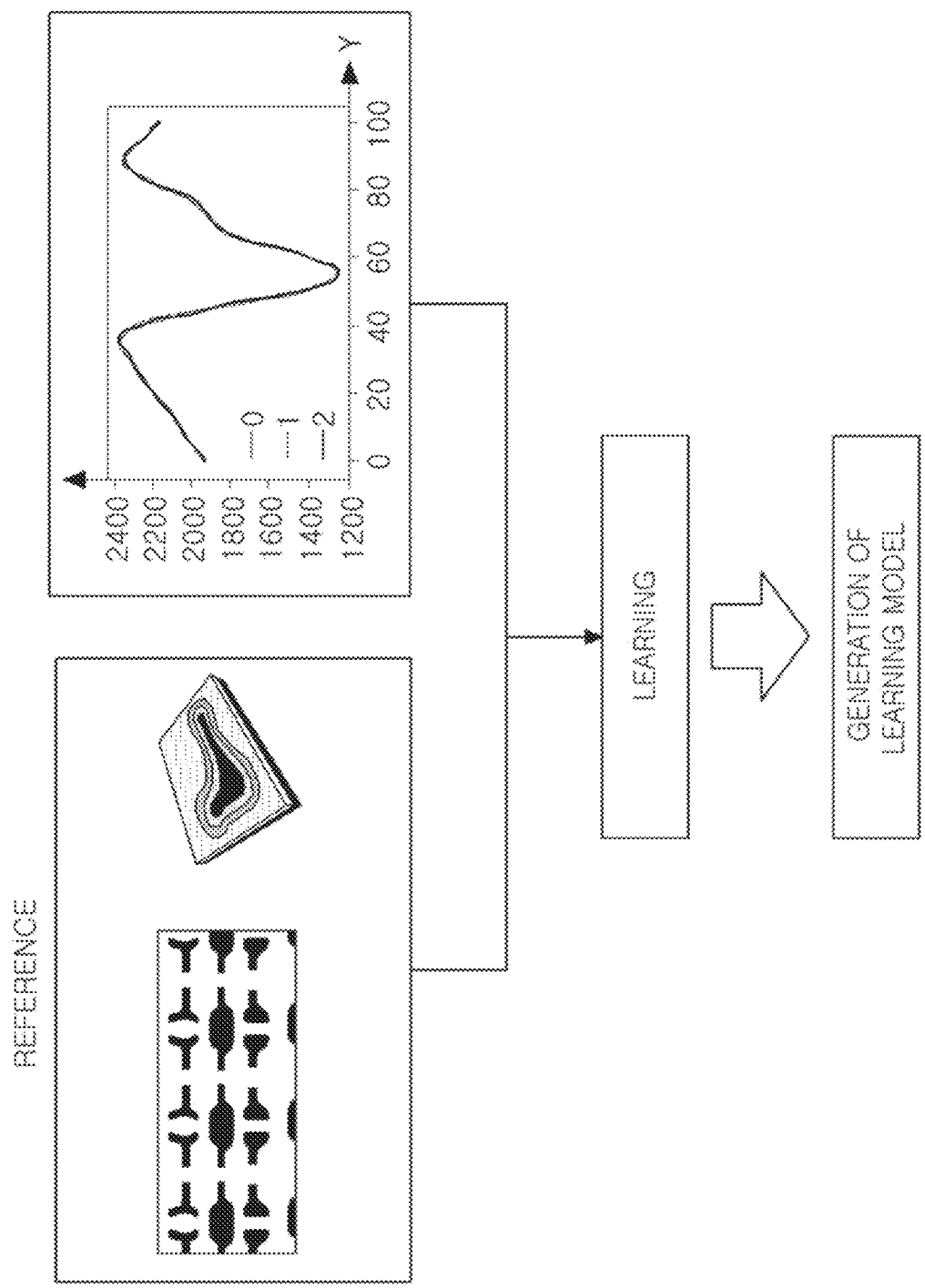
FIG. 14 is a diagram illustrating a process of generating a learning model according to an example embodiment.

An intensity profile according to an example embodiment may include a one-dimensional array of intensity values extracted from a through-focus image. In general, information on a change in CD and thickness according to the through-focus image may appear as a change in intensity profile at a defocus position. By extracting the intensity profile, the change in intensity profile may be used as a spectrum for a wavelength. By learning the intensity profile, metrology values may be extracted from the through-focus image. In an example embodiment, general tools for wavelength spectrum learning may be used to extract the intensity profile. FIG. 14 is a diagram illustrating a process of generating a learning model according to an example embodiment Referring to FIG. 14, a learning model may be generated by training an artificial neural network using reference data, for example, AFM data, and a through-focus image profile.

Figure 15:
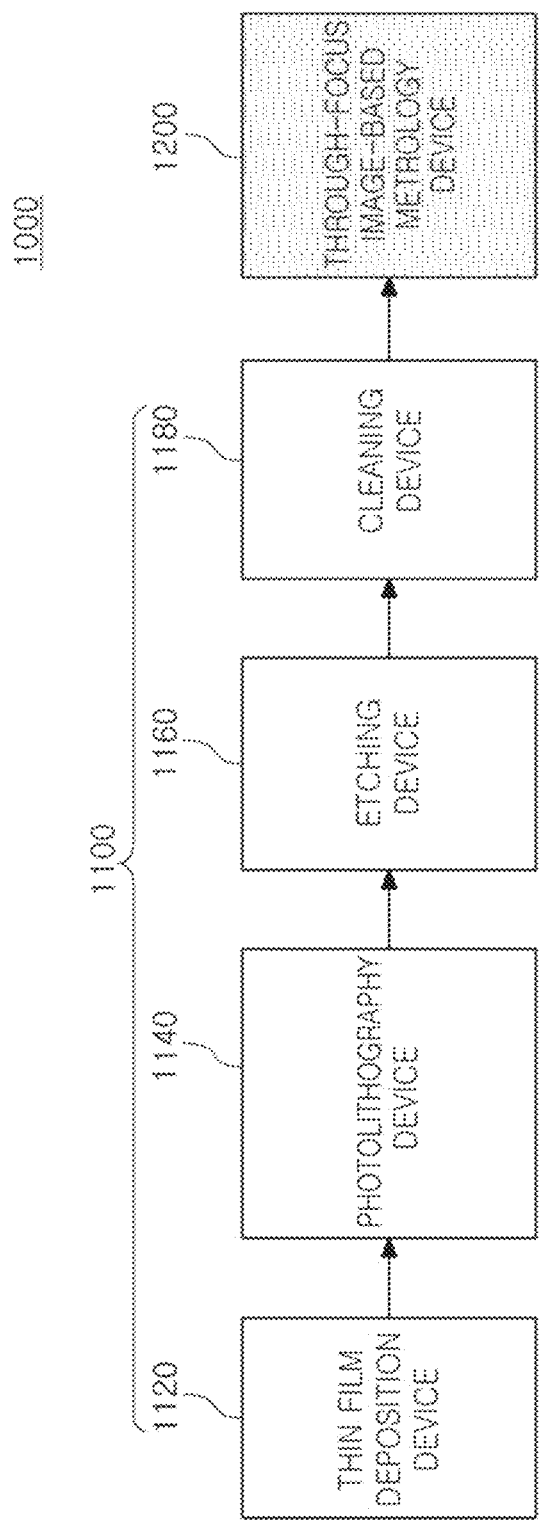
FIG. 15 is a diagram illustrating a semiconductor manufacturing facility having a through-focus image-based metrology device according to an example embodiment.

FIG. 15 is a diagram illustrating a semiconductor manufacturing facility 1000 having a through-focus image-based metrology device according to an example embodiment. Referring to FIG. 15, a semiconductor manufacturing facility 1000 may include a unit process device 1100 and an inspection metrology device 1200.

The unit process device 1100 may perform a unit process of a substrate W. For example, the unit process may include a thin film deposition process, a photolithography process, an etching process, and a cleaning process. In addition, the unit process may include a diffusion process, a heat treatment process, and an ion implantation process.

The inspection metrology device 1200 may perform an inspection process and a metrology process for the substrate W. For example, the inspection process may be a process of inspecting defects, for example, particle defects, electrical short defects, line cut defects, or the like, on the substrate W. The metrology process may be a process of measuring the surface characteristics, for example, critical dimension (CD) thin film thickness, line width, of the substrate W.

In an example embodiment, the unit process device 1100 and the inspection metrology device 1200 may be arranged in a line. In an example embodiment, the unit process device 1100 may be disposed on a front end of the inspection metrology device 1200. For example, the unit process device 1100 may include a thin film deposition device 1120, a photolithography device 1140, an etching device 1160, and a cleaning device 1180. The thin film deposition device 1120 may form a thin film on the substrate W. The photolithography device 1140 may form a photoresist pattern on the substrate W or the thin film. The etching device 1160 may etch the thin film on the substrate W, based on the photoresist pattern. The cleaning device 1180 may clean the substrate W. The unit process device 1100 may include a diffusion device, a heat treatment device, and an ion implantation device. The inspection metrology device 1200 may be disposed on a rear end of the unit process device 1100.

The inspection metrology device 1200 may inspect and perform metrology on an upper surface of the substrate W on which a unit process has been completed. According to another example embodiment, the inspection metrology device 1200 may be disposed in the unit process device 1100. For example, the inspection metrology device 1200 may be disposed between the thin film deposition device 1120 and the photolithography device 1140 and between the photolithography device 1140 and the etching device 1160. The inspection metrology device 1200 may inspect whether the unit process is normal. In an example embodiment, the inspection metrology device 1200 may acquire information on a result of the unit process. An inspection metrology device 1200 according to example embodiments may include the through-focus image-based metrology device 10 described in FIGS. 1 to 14.

Figure 16:
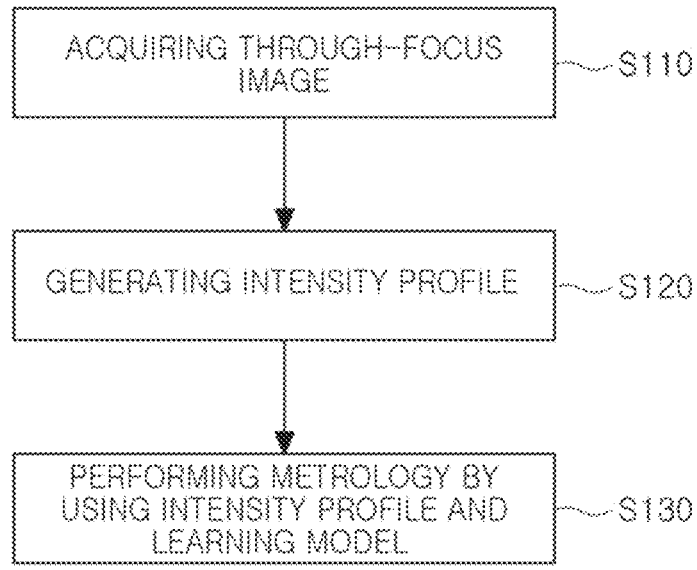
FIG. 16 is a flowchart illustrating an operation method of a through-focus image-based metrology device according to an example embodiment.

FIG. 16 is a flowchart illustrating an operation method of a through-focus image-based metrology device according to an example embodiment. Referring to FIGS. 1 to 16, an operation method of a through-focus image-based metrology device 10 may include the following steps.

A computing device 200 may control an optical device 100 to acquire a through-focus image (S110). The computing device 200 may generate an intensity profile from the through-focus image (S120). The computing device 200 may use the intensity profile and a learning model to generate metrology data (S130).

In an example embodiment, the optical device 100 may include a stage 150 (see FIG. 1) on which a target is provided, an image sensor 120 (see FIG. 1) disposed on the stage 150, an objective lens 140 (see FIG. 1) disposed between the image sensor 120 and the stage 150 and outputting reflected light of the target, and at least one light source 110 (see FIG. 1) providing illumination light to the target through the objective lens 140. In an example embodiment, acquiring a plurality of through-focus images may further include moving the stage 150 by one step in the computing device 200 in at least one direction.

In an example embodiment, the acquiring the plurality of through-focus images may further include moving the image sensor 120 by one step in the computing device 200 in at least one direction.

In an example embodiment, the acquiring the plurality of through-focus images may further include adjusting a difference in phase of reflected light. In an example embodiment, a learning model may be generated through learning.

Figure 17:
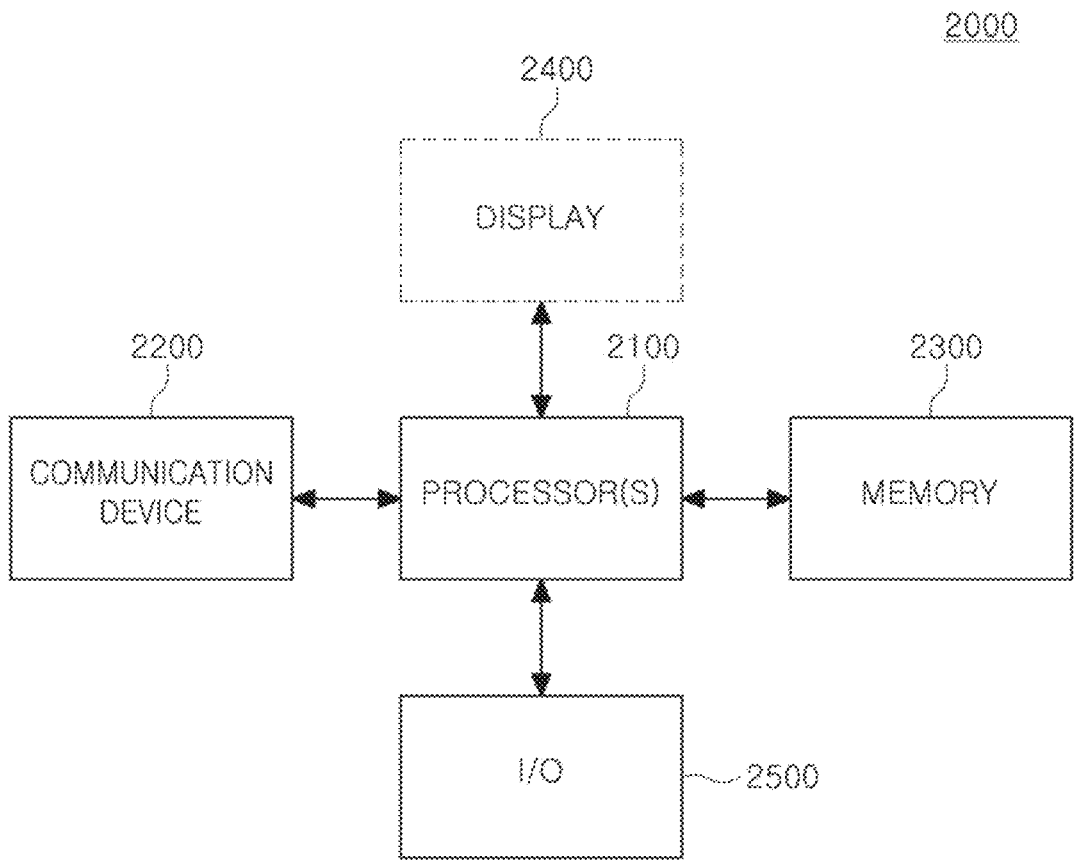
FIG. 17 is a diagram illustrating a computing device according to an example embodiment.

FIG. 17 is a diagram illustrating a computing device 2000 according to an example embodiment. Referring to FIG. 17, a computing device 2000 may include at least one processor 2100, a network interface 2200, a memory 2300, a display 2400, and an input/output device 2500.

The processor 2100 may be configured to execute at least one instruction or program for performing the through-focus image-based metrology method described in FIGS. 1 to 16. The processor 2100 may execute an instruction, and may control the computing device 2000.

In an example embodiment, at least one instruction may be executed in the at least one processor 2100, to control the optical device according to example embodiments to acquire a plurality of through-focus images of a target, may generate an intensity profile, corresponding to the target, from the plurality of through-focus images, and use the generated intensity profile and a learning model to generate metrology data for the target.

In an example embodiment, at least one instruction may be executed in the at least one processor 2100, to move the optical device 100 by one step in at least one direction. In this case, the at least one direction may include an optical axis direction of reflected light output from a target between the stage 150 (see FIG. 2A), on which the target is provided, and the image sensor 120 (see FIG. 2A).

In an example embodiment, at least one instruction may be executed in the at least one processor 2100, to divide a region, corresponding to a target, in any one through-focus image, among a plurality of through-focus images, into a plurality of segments, and extract an intensity from the divided segments to generate an intensity profile.

In an example embodiment, at least one instruction may be executed in the at least one processor 2100, to divide each region of interest in a plurality of through-focus images into a plurality of segments, and generate an intensity profile from each of the plurality of segments.

In an example embodiment, at least one instruction may be executed in the at least one processor 2100, to divide each region of interest in the plurality of through-focus images into a plurality of segments, and generate an intensity profile from each of the plurality of segments. In an example embodiment, the intensity profile may include an intensity profile in a first direction (an X-axis direction) or an intensity profile in a second direction (a Y-axis direction), the first and second directions may be perpendicular to a third direction (a Z-axis direction), the first and second directions may be perpendicular to each other, and the plurality of through-focus images may be acquired by scanning the target in the third direction.

In an example embodiment, at least one instruction may be executed in the at least one processor 2100, to convert through-focus image data into intensity profile data, and generate a learning model by using an artificial neural network to learn reference data and the converted intensity profile data.

In an example embodiment, at least one instruction may be executed in the at least one processor 2100, to generate metrology data by performing a deep learning operation on generated intensity profile and a learning model.

The computing device 2000 may be connected to an external device, for example, a personal computer or a network, through the input/output device 2500, and may exchange data.

The network interface 2200 may be configured to perform communication with an external network through various wired/wireless methods.

The memory 2300 may be configured to store at least one instruction. The processor 2100 may perform the aforementioned operations, as at least one instruction stored in the memory 2300 is executed in the at least one processor 2100. In an example embodiment, the memory 2300 may store metrology recipes having different driving steps, depending on a type of the target.

The memory 2300 may be a volatile memory or a non-volatile memory. The memory 2300 may include a storage device to store user's data. The storage device may be an embedded multimedia card (eMMC), a solid state drive (SSD), a universal flash storage (UFS), or the like. The storage device may include at least one non-volatile memory device. The non-volatile memory device may be a NAND flash memory, a vertical NAND (VNAND), a NOR Flash Memory, a resistive random access memory (RRAM), a phase change memory (PRAM), a magneto-resistive random access memory (MRAM), a ferroelectric random access memory (FRAM), a spin transfer torque random access memory (STT-RAM), or the like.

The example embodiments described above may be implemented as a hardware component, a software component, and/or a combination of the hardware component and the software component. For example, devices, methods, and components described in the embodiments may be implemented by using one or more general purpose computers or special purpose computers, for example, a processor, a controller, an arithmetic logic unit (ALU), a digital signal processor, a microcomputer, a field programmable gate array (FPGA), a programmable logic unit (PLU), a microprocessor, or any other device capable of executing and responding to instructions. The processing unit may execute an operating system (OS) and one or more software applications executed on the operating system.

In addition, the processing unit may access, store, manipulate, process, and generate data in response to the execution of software. For the convenience of understanding, although it is sometimes described that one processing unit is used, those of ordinary skill in the related technical field, it can be seen that the processing unit may include a plurality of processing elements and/or multiple types of processing elements. For example, the processing unit may include a plurality of processors, or a processor and a controller. In addition, other processing configurations such as a parallel processor are possible.

Software may include a computer program, a code, an instruction, or a combination of one or more of them, and may configure the processing unit to operate as desired, or may command the processing unit independently or collectively. The software and/or data may be permanently or temporarily embodied by a type of machine, a component, a physical device, virtual equipment, a computer storage medium or device, or in the transmitted signal wave, to be interpreted by a processing unit or to provide instructions or data to the processing unit. The software may be distributed over networked computer systems, and may be stored or executed in a distributed manner. The software and data may be stored on one or more computer-readable recording media.

A method according to an example embodiment may be implemented in a form of a program instruction capable of being executed through various computer means, and may be recorded in a computer-readable medium. The computer-readable medium may include a program instruction, a data file, a data configuration, or the like alone or in combination. A program instruction recorded on the medium may be specially designed and configured for an example embodiment, or may be known to and usable by those skilled in the computer software. Examples of the computer-readable medium may include hardware devices specially configured to store and execute program instructions, such as a magnetic medium such as a hard disk, a floppy disk, and a magnetic tape, an optical medium such as a CD-ROM and a DVD, and a magneto-optical medium such as a floptical disk, ROM, RAM, flash memory, or the like. Examples of the program instructions may include not only machine language codes such as those produced by a compiler, but also high-level language codes that may be executed by a computer using an interpreter or the like. The hardware device described above may be configured to operate as one or more software modules to perform an operation of an embodiment, and vice versa.

An device for imaging an object according to an example embodiment may include a configuration capable of selecting an illumination side angular component, a configuration capable of selecting an image side angular component, a configuration capable of selecting each angular component, and allowing a shift in phase, and a configuration capable of driving the object or an optical system in the Z-axis direction.

A control and calculation device according to an example embodiment may control a sequence for generating a through-focus image, may extract an intensity profile from the through-focus image, and may use a pre-made learning model to generate a metrology value.

A metrology device according to an example embodiment may be used to change an intensity profile in a defocus region, not an on-focus region, due to structural changes such as CD/thickness of the object or the like, to calculate a metrology value.

A metrology device according to an example embodiment may perform metrology for a repetitive or non-repetitive pattern of an object much smaller than an OCD beam size, and may have a resolution corresponding to a pixel size of an optical system.

According example embodiments, a through-focus image-based metrology device, an operation method thereof, and a computing device for executing the operation, may execute metrology on a target of a repetitive or non-repetitive pattern in a non-destructive manner by using a learning model and an intensity profile extracted from a through-focus image.

While example embodiments have been illustrated and described above, it will be apparent to those skilled in the art that modifications and variations could be made without departing from the scope as defined by the appended claims.

What is claimed is:

1. A through-focus image-based metrology device comprising:
   an optical device; and
   at least one processor configured to:
   acquire a plurality of through-focus images of a target from the optical device;
   divide a target region in the plurality of through-focus images into a plurality of segments;
   extract an intensity from each of the plurality of segments, and generate an intensity profile based on intensities of the plurality of segments; and
   perform metrology on the target based on the generated intensity profile,
   wherein the optical device comprises:
   a stage on which the target is disposed, the stage being configured to move by one step in at least one direction according to control of the at least one processor, and to acquire the plurality of through-focus images;
   an image sensor;
   an objective lens disposed between the image sensor and the stage, the objective lens being configured to transmit reflected light from the target;
   a light source configured to emit illumination light to the target through the objective lens;
   a collimator configured to convert the illumination light received from the light source into parallel light;
   an illumination angle adjuster configured to adjust an illumination angle of the parallel light output from the collimator to adjust an incident angle of the light on the target; and
   a beam splitter configured to reflect a portion of the illumination light passing through the illumination angle adjuster to the target or to transmit the reflected light from the target.

2. The through-focus image-based metrology device of claim 1, wherein the optical device further comprises a first relay lens disposed between the illumination angle adjuster and the beam splitter.

3. The through-focus image-based metrology device of claim 1, wherein the at least one processor is further configured to extract the intensity from each of the plurality of segments based on a step movement, and
   the at least one processor is further configured to compare the generated intensity profile with a learning model to measure the target.

4. The through-focus image-based metrology device of claim 1, wherein the at least one processor is further configured to convert at least one through-focus image among the plurality of through-focus images into profile data and learn the profile data and reference data, to generate a learning model.

5. The through-focus image-based metrology device of claim 1, wherein the at least one processor is further configured to extract the intensity from each of the plurality of segments based on a step movement, and
   the at least one processor is further configured to:
   generate intensity profiles based on extracted intensities; and
   quantify a difference in the generated intensity profiles to measure the target.

6. The through-focus image-based metrology device of claim 1, wherein the optical device further comprises a tube lens configured to condense the reflected light output from the beam splitter to the image sensor.

7. The through-focus image-based metrology device of claim 6, wherein the optical device further comprises:
a reflection angle and phase adjuster configured to adjust an angle of the reflected light or to shift a phase of the reflected light; and
a relay lens disposed between the reflection angle and phase adjuster and the beam splitter.

8. The through-focus image-based metrology device of claim 7, wherein the shift in phase is determined based on an absolute value of a difference between a first phase of the reflected light passing through a coated portion and a second phase of the reflected light passing through an uncoated portion.

9. The through-focus image-based metrology device of claim 7, wherein the reflection angle and phase adjuster is further configured to adjust a thickness of a coating or a substrate to control the shift in phase.

10. A method of operating a through-focus image-based metrology device comprising an optical device and at least one processor controlling the optical device, wherein the optical device comprises a stage on which a target is disposed, the stage being configured to move by one step in at least one direction according to control of the at least one processor, and to acquire a plurality of through-focus images; an image sensor; an objective lens disposed between the image sensor and the stage, the objective lens being configured to transmit reflected light from the target a light source configured to emit illumination light to the target through the objective lens; a collimator configured to convert the illumination light received from the light source into parallel light an illumination angle adjuster configured to adjust an illumination angle of the parallel light output from the collimator to adjust an incident angle of the light on the target and a beam splitter configured to reflect a portion of the illumination light passing through the illumination angle adjuster to the target or to transmit the reflected light from the target, the method comprising:
controlling the optical device by the at least one processor to acquire the plurality of through-focus images of the target;
generating an intensity profile, corresponding to the target, based on the plurality of through-focus images by the at least one processor;
converting at least one through-focus image among the plurality of through-focus images into profile data and learning the profile data and reference data, to generate a learning model; and
generating metrology data for the target based on the generated intensity profile and the learning model by the at least one processor.

11. The method of claim 10,
wherein the acquiring the plurality of through-focus images further comprises moving an image optical system, related to the image sensor, by one step in at least one direction according to control of the at least one processor.

12. The method of claim 10, wherein the acquiring the plurality of through-focus images further comprises adjusting a phase of reflected light output from the target.

13. The method of claim 10, further comprising generating the learning model using an artificial neural network.

14. A method of operating a through-focus image-based metrology device comprising an optical device and at least one processor controlling the optical device, wherein the optical device comprises a stage on which a target is disposed, the stage being configured to move by one step in at least one direction according to control of the at least one processor, and to acquire a plurality of through-focus images; an image sensor; an objective lens disposed between the image sensor and the stage, the objective lens being configured to transmit reflected light from the target a light source configured to emit illumination light to the target through the objective lens; a collimator configured to convert the illumination light received from the light source into parallel light an illumination angle adjuster configured to adjust an illumination angle of the parallel light output from the collimator to adjust an incident angle of the light on the target and a beam splitter configured to reflect a portion of the illumination light passing through the illumination angle adjuster to the target or to transmit the reflected light from the target, the method comprising:
controlling, by the at least one processor, the optical device to acquire the plurality of through-focus images for the target;
dividing, by the at least one processor, a region, corresponding to the target, in the plurality of through-focus images, into a plurality of segments;
extracting, by the at least one processor, an intensity from each of the plurality of segments;
generating, by the at least one processor, an intensity profile, corresponding to the target, based on intensities from the plurality of segments of the plurality of through-focus images; and
generating, by the at least one processor, metrology data for the target based on the generated intensity profile and a learning model.

15. The method of claim 14, wherein the at least one direction comprises an optical axis direction of reflected light output from the target between the image sensor and the stage on which the target is disposed.

16. The method of claim 14, wherein the at least one processor is further configured to use metrology recipes having different driving steps, according to a type of the target.

* * * * *